(12) United States Patent
Welsch et al.

(10) Patent No.: US 6,914,769 B2
(45) Date of Patent: Jul. 5, 2005

(54) HIGH POWER CAPACITORS FROM THIN LAYERS OF METAL POWDER OR METAL SPONGE PARTICLES

(75) Inventors: Gerhard E. Welsch, Cleveland Heights, OH (US); Donald L. McGervey, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 51 days.

(21) Appl. No.: 10/182,927

(22) PCT Filed: Feb. 2, 2001

(86) PCT No.: PCT/US01/03528

§ 371 (c)(1),
(2), (4) Date: Aug. 2, 2002

(87) PCT Pub. No.: WO01/57928

PCT Pub. Date: Aug. 9, 2001

(65) Prior Publication Data

US 2003/0169560 A1 Sep. 11, 2003

Related U.S. Application Data

(60) Provisional application No. 60/181,132, filed on Feb. 8, 2000, and provisional application No. 60/179,977, filed on Feb. 3, 2000.

(51) Int. Cl.[7] ................................................ H01G 9/00
(52) U.S. Cl. ..................... 361/508; 361/509; 361/512; 361/516; 361/525; 361/530
(58) Field of Search ................................. 361/508, 509, 361/511, 512, 516, 519, 520, 523, 525, 528, 529, 530, 532; 257/306, 295, 296

(56) References Cited

U.S. PATENT DOCUMENTS

| | | | |
|---|---|---|---|
| 4,164,005 A | 8/1979 | Cheseldine | |
| 4,623,910 A | 11/1986 | Risberg | |
| 5,254,137 A | 10/1993 | Mitani | |
| 5,592,009 A | 1/1997 | Hidaka | |
| 5,729,428 A | 3/1998 | Sakata et al. | |
| 6,144,057 A | * 11/2000 | Yamazaki | ............ 257/306 |
| 6,226,173 B1 | * 5/2001 | Welsch et al. | ............ 361/508 |

* cited by examiner

*Primary Examiner*—Dean A. Reichard
*Assistant Examiner*—Nguyen T. Ha
(74) *Attorney, Agent, or Firm*—Tarolli, Sundheim, Covell & Tummino L.L.P.

(57) ABSTRACT

An anode (14, 208, 410) and/or cathode (12, 212, 420) of a capacitor has a large surface area. The high surface area of the anode is provided by forming the anode from a thin, electrically conductive layer (16) formed from metal particles (18) or an electrically conductive metallic sponge (416). These materials provide a porous structure with a large surface area of high accessibility. The particles are preferably directional or non-directional sponge particles of a metal, such as titanium. The conductive layer has a dielectric film (36, 236, 414) on its surface, formed by anodizing the particle surfaces. The dielectric film has a combination of high dielectric constant and high dielectric strength. The cathode (12, 212, 420) of the capacitor is either a conventional solid material or, more preferably, has a large surface provided by forming the surface from a sponge or particles analogously to the anode. The high dielectric strengths obtainable from the capacitor allow for extreme miniaturization, making the capacitor particularly suited for integrated circuit applications.

37 Claims, 16 Drawing Sheets ure regulators, motor control-regulators, computer electronics,
HIGH POWER CAPACITORS FROM THIN LAYERS OF METAL POWDER OR METAL SPONGE PARTICLES This application is a 371 of PCT/US01/03528 filed Feb. 2, 2000 which claims benefit of Provisional Application No. 60/179,977 filed Feb. 3, 2000 and Provisional Appl. No. 60/181,132 filed Feb. 8, 2000.

BACKGROUND OF THE INVENTION

The present invention relates to the capacitor arts. It finds particular application in conjunction with titanium, aluminum, tantalum and other metal sponges or particles in the form of thin layers for providing capacitor anodes and cathodes of high surface area, and will be described with particular reference thereto. It should be appreciated, however, that the invention is also applicable to a variety of applications in which a high accessible surface area to volume ratio is desired.

Electrical devices, such as power supplies, switching regulators, motor control-regulators, computer electronics, audio amplifiers, surge protectors, and resistance spot welders often require substantial bursts of energy in their operation. Capacitors are energy storage devices that are commonly used to supply these energy bursts by storing energy in a circuit and delivering the energy upon timed demand. Typically, capacitors consist of two electrically conducting plates, referred to as the anode and the cathode, which are separated by a dielectric film. In order to obtain a high capacitance, a large dielectric surface area is used, across which the electrical charge is stored. The capacitance, C of a capacitor is determined by the formula:

$$C \text{ [Farads]} = \frac{Q \text{ [coulombs]}}{V \text{ [volts]}} \quad (1)$$

where Q is the electrical charge and V is the voltage between the plates. Capacitance is proportional to the charge-carrying area of the facing plates, A, and is inversely proportional to the gap width, X, so that $$C \text{ [Farads]} = (\varepsilon \cdot \varepsilon_0 \text{ [F/m]}) \frac{A \text{ [m}^2\text{]}}{X \text{ [m]}} \quad (2)$$

where $(\varepsilon \cdot \varepsilon_0)$ is a proportionality constant, $\varepsilon_0$ is the permittivity of vacuum (value=$8.85 \times 10^{-12}$ Farad/m), and $\varepsilon$ is the relative permittivity or dielectric constant for a dielectric substance. High capacitance capacitors should have a large area, A, and a thin dielectric film with a high dielectric constant.

Commercial capacitors attain large surface areas by one of two methods. The first method uses a large area of thin foil as the anode and cathode. See, e.g., U.S. Pat. No. 3,410,766. The foil is either rolled or stacked in layers. In the second method, a fine powder is sintered to form a single slug with many open pores, giving the structure a large surface area. See, e.g., U.S. Pat. No. 4,041,359. Both these methods require considerable processing to obtain the desired large surface area. In addition, the sintering method results in many of the pores being fully enclosed and thus inaccessible to the dielectric.

To be effective as an energy storage device, a capacitor should have a high energy density (Watt-hours per unit mass) and to be effective as a power delivering device a capacitor should have a high power density (Watts per unit mass). Conventional energy storage devices tend to have one, but not both, of these properties. For example, lithium ion batteries have energy densities as high as 100 Wh/kg, but relatively low power densities (1–100 W/kg). Examples of energy storage devices with high power density are RF ceramic capacitors. Their power densities are high, but energy densities are less than 0.001 Wh/kg. The highest energy capacitors available commercially are the electrochemical supercapacitors. Their energy and power densities are as high as 1 Wh/kg and 1,000 W/kg, respectively.

The dielectric film within the capacitor serves as the energy storage medium. Energy density is the amount of stored energy per unit volume of dielectric. To maximize the energy density of a capacitor, it is desirable to have a dielectric with a large surface per volume, a high dielectric constant, and a high dielectric strength. The energy density is a function of the dielectric constant and the dielectric strength, as follows:

Energy density=dielectric constant×(dielectric strength)² (3)

A good capacitor geometry is one in which the dielectric is readily accessed electrically, that is, it has a low equivalent series resistance that allows rapid charging and discharging. High electrical resistance of the dielectric prevents leakage current. A good dielectric, therefore, has a high electrical resistance which is uniform at all locations. Additionally, long-term stability (many charging-discharging cycles) is desired. Conventionally, dielectrics tend to become damaged during use.

The present invention provides a new and improved capacitor having at least one of its electrodes (anode or cathode) of high surface area which overcomes the above-referenced problems, and others.

SUMMARY OF THE INVENTION

In accordance with one aspect of the present invention, a capacitor is provided. The capacitor includes an anode, a dielectric film on a surface of the anode, and a cathode which includes an electrolyte in contact with the dielectric film. The capacitor is characterized by at least one of the anode and cathode comprising a porous layer of particles formed from an electrically conductive material.

In accordance with another aspect of the present invention, a method of forming a capacitor is provided. The method includes providing an anode and a cathode and forming a dielectric film on a surface of the anode. The method is characterized by forming at least one of the anode and cathode from a porous layer of particles.

In accordance with another aspect of the present invention, a semiconductor device is provided. The device includes a semiconductor substrate with at least one capacitor on a surface of the semiconductor substrate. The capacitor includes an anode, a cathode, and a dielectric layer between the anode and cathode. The dielectric layer being electrolytically formed.

In accordance with another aspect of the present invention, a method of forming a semiconductor device includes depositing a layer of an electrically conductive material on a semiconductor substrate). The method includes forming a dielectric layer by oxidizing a portion of the electrically conductive material.

One advantage of at least one embodiment of the present invention is that anodes with large surface areas per unit mass are formed, thereby enabling the size of the capacitor to be reduced.

Another advantage of at least one embodiment of the present invention is that it enables capacitors with energy densities of $10^{-2}$ to 100 Wh/kg and power densities of 100,000 to 10,000,000,000 W/kg, or more, to be produced. For capacitors with liquid metal-backed electrolytes, even higher power densities are possible.

Another advantage of at least one embodiment of the present invention is that titanium capacitors produced are suited to use in applications operating at frequencies between 20 Hz and 20,000 Hz.

Another advantage of at least one embodiment of the present invention arises from the ability to grow an efficient dielectric film on the anode surface, which is able to self-repair when damaged.

Another advantage of at least one embodiment of the present invention is that capacitors formed have a low equivalent series resistance and a low thermal resistance, reducing the risk of a capacitor fire in the event of a capacitor breakdown.

Another advantage of at least one embodiment of the present invention is that a layer of particles or a sponge used to form the anode has good heat dissipation, allowing the capacitor to operate at higher power dissipation levels and with higher power output without developing hot spots.

Still further advantages of the present invention will become apparent to those of ordinary skill in the art upon reading and understanding the detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment, and are not to be construed as limiting the invention.

FIG. 7 is a schematic diagram of a process for forming porous particles by an oxidation and reduction method.

FIG. 12 shows the formation of a capacitor of the present invention on a semiconductor chip.

DETAILED DESCRIPTION OF THE PREFERRED EMBODIMENTS

Capacitor anodes with a large accessible surface area include a porous surface layer which may be produced from a thin layer of metallic particles or sponge material. An effective dielectric is readily formed on the surface of the porous layer by oxidation of the accessible surface of the particles or sponge, or by coating the surface with a suitable dielectric material. The power densities which may be achieved are high and power dissipation factors low during capacitor operation.

While particular reference is made herein to capacitors in which an anode having a large surface area includes a porous surface layer of particles, it is to be understood that the anode may alternatively be provided with a large surface area by forming the anode from a continuous layer of directional, partially directional, or non-directional sponge. Additionally or alternatively, the cathode of the capacitor may be provided with a large surface area, which may be analogously formed from a porous surface layer of particles or a continuous sponge layer.

Figure 1:
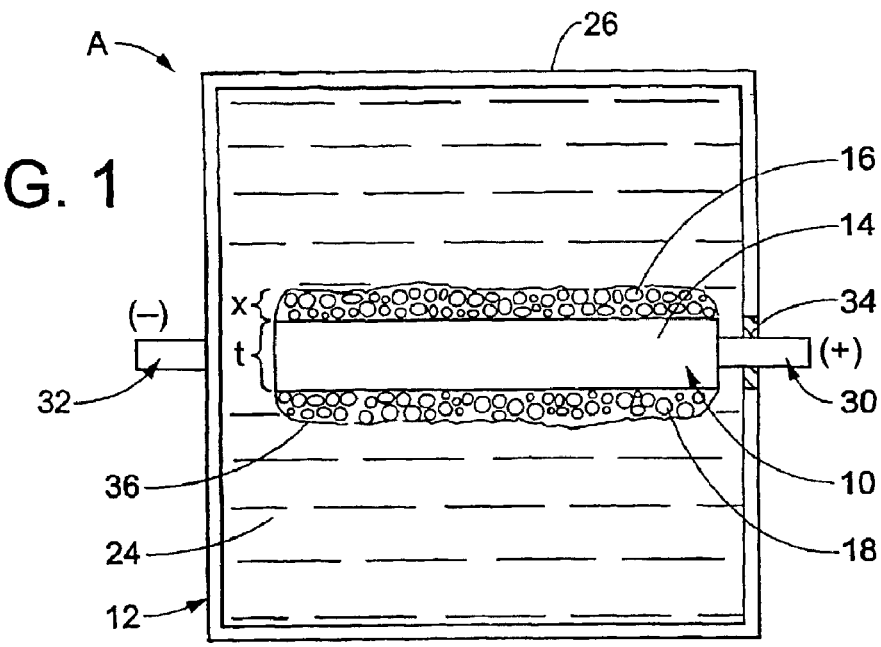
FIG. 1 is a schematic side sectional view of a capacitor according to a first embodiment of the present invention.
Figure 2:
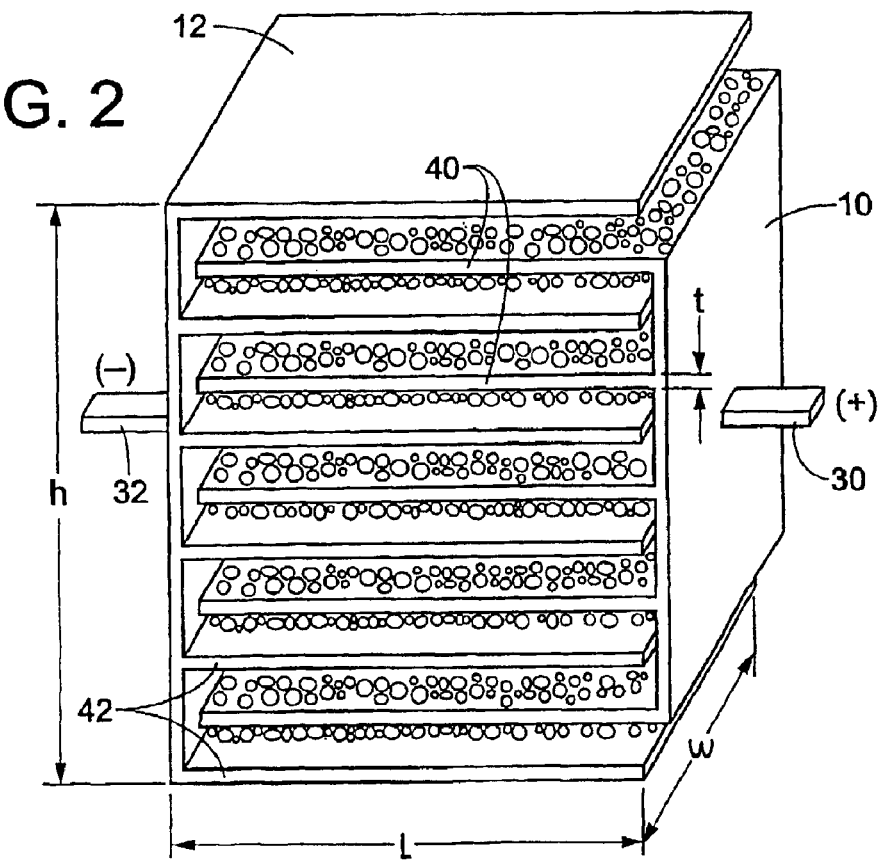
FIG. 2 is a perspective view of interdigitated anode and cathode sheets of a capacitor in accordance with a second embodiment of the present invention.

With reference to FIGS. 1 and 2, a first embodiment of a capacitor A includes an anode 10 and a cathode 12. The anode includes an electrically conducting substrate 14 and a porous, electrically conducting layer 16 of metallic particles 18 on a surface 20 of the substrate. The particles are in sufficient contact with each other to provide good conductivity through the layer 16 and between the layer and the underlying substrate 14.

While the capacitor will be described initially with reference to a particulate porous layer, it should be appreciated that the porous layer may also be formed from a directional or non directional sponge grown on a suitable substrate support, or without a substrate support. Further details regarding formation of anodes from sponge will be provided separately. Additionally, large surface area capacitor cathodes formed from a layer of particles or a grown sponge are also contemplated.

An electrolyte 24 surrounds the anode 10, and also forms part of the cathode 12. The cathode 12 may include a casing 26 which provides an outer cover for the capacitor. The casing may be formed from any suitable rigid conducting material, such as aluminum, brass or copper. Preferably, the cathode casing is of the same material as the anode to avoid galvanic effects.

Conductor leads 30 and 32 connect the anode and the cathode, respectively, with an electrical circuit (not shown) in which the capacitor is used. An annular insulating seal 34, formed from a glass bead or other suitable material, insulates the anode lead from the casing 26. A dielectric material 36, in the form of a continuous film on the particles 18, is interposed between the particles and the electrolyte 24. It is preferably formed by anodic oxidization of the surface of the particles, as will be described in greater detail herein.

To maximize the anode and cathode surface areas, the anode and cathode portions may be inter-leaved. Preferably, as shown in FIG. 2, the anode 10 comprises a number of generally parallel sheets 40, which are connected at an outer end thereof. Each of the sheets comprises a substrate layer 14 and a porous layer 16 of the particles. The anode sheets are preferably inter-leaved with corresponding metal sheets 42 of the cathode 12, which are similarly connected to each other. The outermost cathode sheets 42 provide electrical support for the cathode and also serve as part of the encapsulating housing or casing 26 for the capacitor. Alternatively, the anode and cathode are wrapped in a spiral configuration (not shown). Other configurations are also contemplated.

The anode sheets 40 and the cathode sheets 42 are preferably of a sufficient thickness that their rigidity is such that the anode and cathode do not come into direct contact with each other. Alternatively, a spacer material, such as a sheet of felt, cloth, porous or fibrous insulator material, such as glass, plastic, ceramic, or paper, may be inserted between each anode sheet 40 and the adjacent cathode sheet 42 to maintain a separation. Where the electrolyte is a solid, this may provide the spacer material.

The electrolyte may be a solid coating, such as $MnO_2$, which is deposited on the dielectric film. It preferably serves as an oxidizing agent that provides self-repairing ability to dielectric oxide film 36. The electrolyte also acts as an electrical conductor by which the cathode is in contact with the anode.

Figure 3:
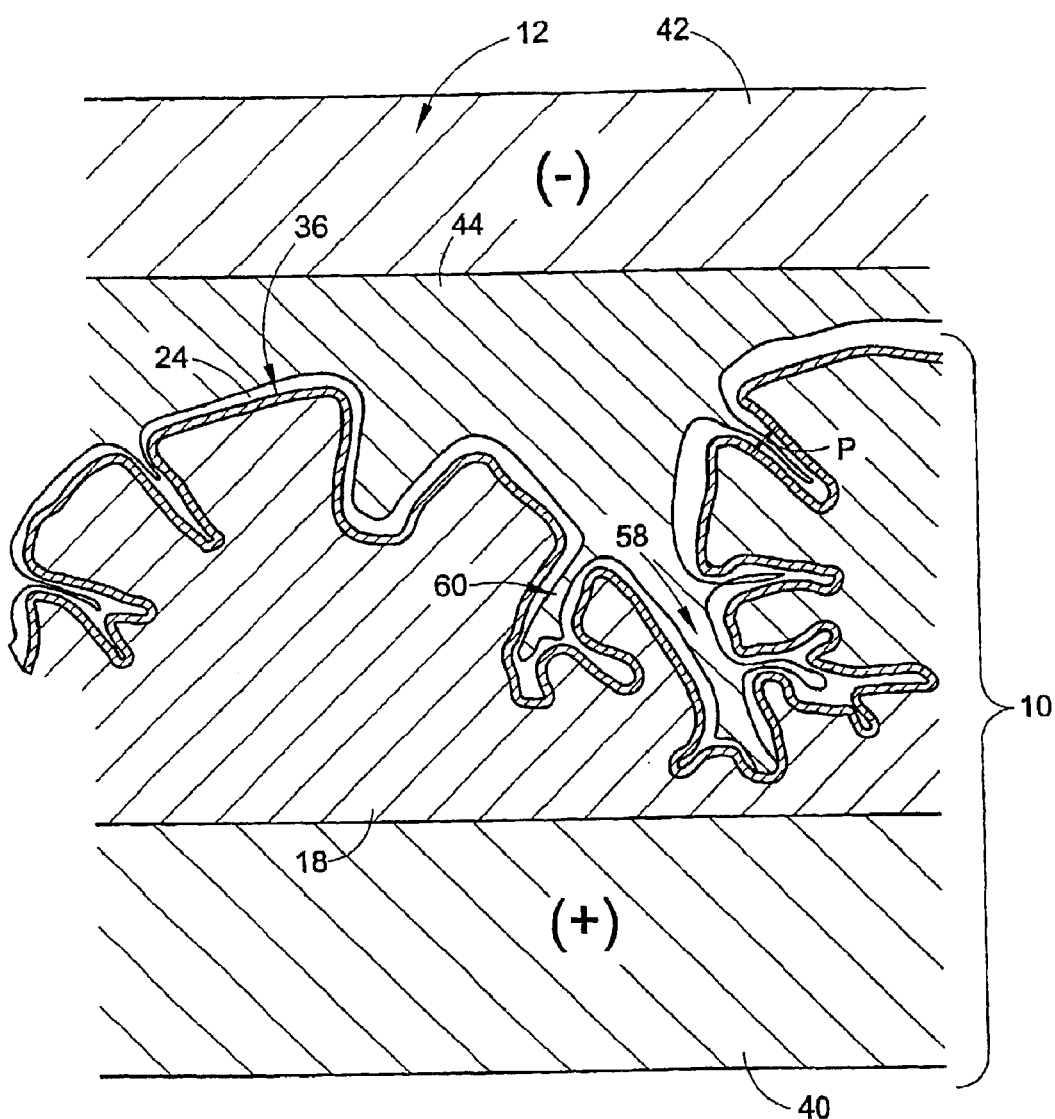
FIG. 3 is an enlarged sectional view of the anode and cathode of FIG. 1.

With reference also to FIG. 3, which shows a greatly enlarged view of an anode and cathode, the cathode may also include a high conductivity filler material 44, which fills the space between the electrolyte 24 and the cathode sheets 42. The filler material lowers the electrical resistance of the capacitor. The filler material serves essentially the same functions as the electrolyte, except in that it need not serve the repair function of the electrolyte. In a preferred embodiment, the high-conductivity filler material 44 is a liquid, or partially liquid metal. It preferably has an electrical resistivity of less than 1 $\Omega$·cm. Suitable filler materials are liquid metals or alloys having a low melting temperature, which are readily infiltrated into the space between the electrolyte and the cathode. Examples include mercury, gallium, indium and eutectic alloys of alkali metals, such as a eutectic alloy of potassium and caesium. Various conductive polymers may also provide good filler materials. In the case of mercury, the capacitor should be hermetically sealed to prevent egress of the mercury. Capacitors using fillers which are reactive with water, such as potassium, should also be sealed from the surrounding environment.

Such electrolyte/filler systems are capable of providing extremely low time constants (of the order of 1 nanosecond, or less). For example, if the electrolyte is the same thickness as the dielectric, the time constant RC is determined by:

$$RC = \in \cdot \rho$$

where R is the series resistance (ohm)
C is the capacitance (farad)
RC is the discharge time (seconds)
$\in$ is the dielectric constant of the dielectric (F/m)
$\rho$ is the electrical resistivity of the electrolyte (Ohm.m)

For example, for $Ta_2O_5$ as the dielectric and $MnO_2$ as the electrolyte, the time constant RC is less than 1 ns, provided that the electrolyte layer is essentially the same thickness as the dielectric film. This is considerably faster than for conventional electrolytic capacitors which typically have time constants of 1 microsecond or more.

When the electrolyte layer is not the same thickness as the dielectric film then:

$$RC = \in \cdot \rho \cdot \frac{X_e}{X_d}$$

Where $X_e$ is the electrolyte film thickness, and
$X_d$ is the dielectric film thickness.

Thus the time constant increases as the ratio of $X_e:X_d$ increases.

The substrate 14 is preferably in the form of a sheet, although other geometries with a high surface to volume ratio are also contemplated. The substrate provides the anode with structural stability, where needed, and electrical conduction. For higher powered capacitors, a thicker cross-section t and shorter conduction length l is preferred. The substrate may be formed from the same material as the particles, or a different material. Substrates of silver, copper or aluminum are particularly preferred because their high electrical conductivity provides the capacitor with rapid capacitor discharge at very high power without overheating of the conductor leads 30, 32.

Figure 4:
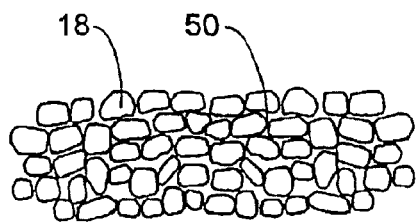
FIG. 4 is an enlarged sectional view of an anode according to a third embodiment of the present invention.
Figure 5:
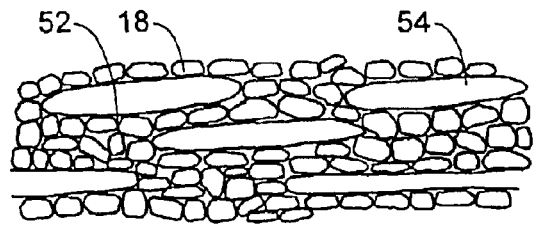
FIG. 5 is an enlarged sectional view of an anode according to a fourth embodiment of the present invention.
Figure 5A:
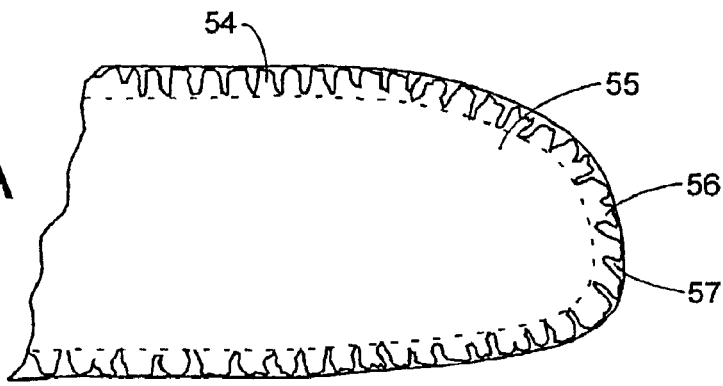
FIG. 5A is a greatly enlarged sectional view of a reinforcing member of FIG. 5.

In an alternative embodiment, shown in FIG. 4, the substrate is omitted and a layer 50 of particles 18 is formed of sufficient thickness to provide its own structural rigidity, where needed, and integrity. Alternatively, as shown in FIG. 5, the anode comprises a layer 52 of particles 18, which is reinforced with structural reinforcing members 54, such as fibers, flakes, wires, wire mesh, ribbons, other suitable structural materials, or combinations of these. Preferably, the structural reinforcing members are formed from an electrically conductive material to enhance the electrical conductivity of the layer. As shown in FIG. 5A, the reinforcing members may each include a solid core 55 and a porous outer region 56. The solid core provides the reinforcing member with high electrical conductivity, while the porous layer, provides a high surface area. The porous outer region may be provided by growing a scale on the reinforcing member (such as by oxidizing the metal in the outer region of the member to its oxide) and then reducing the scale to the corresponding metal, leaving open pores 57 which are accessible from the surface of the reinforcing member.

The particles 18 may be solid or porous particles. In a preferred embodiment, the particles are wholly or partially porous, having at least an outer portion of each particle in the form of a porous sponge, as will be described in greater detail herein. The sponge particles provide a high surface to volume ratio and good surface accessibility. Accessibility of both porous and solid particles is also provided by the small size of the particles and by arranging them in a thin layer.

The accessibility serves a number of functions. First, it improves process efficiency during operations, such as leaching, washing, and vacuum distillation. Second, accessibility facilitates infiltration of an anodizing agent and improved anodizing process efficiency. Third, it allows the electrolyte to infiltrate the layer of particles for good electrical contact. The accessibility is also important for electrical properties in that the conduction paths created are relatively short. This provides a low internal resistance or low series resistance during operation of capacitors formed from the particles. The series resistance is proportional to the thickness x of the porous layer 16 and inversely proportional to the area of the substrate 14. Thus, for a given area of substrate, the series resistance decreases as the layer becomes thinner. However, increasing the thickness x of the porous layer 16 increases the surface area of the dielectric per unit area of the capacitor anode. This, in turn, increases the energy density of the anode. Accordingly, the thickness x of the layer will influence whether the capacitor has a high energy density (thicker layer) or a high power density (thinner layer).

The layer of particles is largely non-directional in its porosity. By non-directional it is meant that the pores which extend through the layer 16, i.e., the larger pores 58 between the particles and the finer pores 60 within the particles, where present, are of varying orientation. In contrast, a directional layer is one in which the pores in the layer are generally, though not necessarily exclusively, aligned perpendicular to the surface of the underlying substrate or with the outer surface of the layer. When the particles themselves are of open or intermediate porosity, the pores 60 within the particles (as shown in FIG. 3) extend from the outer surface of the particle into the interior of the particle. The paths of these internal pores 60 may be tortuous and non-directional, or the paths may be directional (generally perpendicular to the surface of the particle). In either case, the result is a non-directional layer 16 because the pores of the particles are not generally aligned perpendicular to the underlying substrate, or with the surface of the layer. Even where tortuous, the surfaces of the pores are highly accessible because of their relatively short path length so that purification, reduction oxidation, dielectric coating, and electrolyte infiltration are readily achieved.

In a preferred embodiment, a fairly thin layer 16 of porous or solid particles is used to form the anode. By this it is meant that the thickness x of the layer is substantially less than the largest dimension of the sheet. Preferably, the layer thickness is 10% or less of the largest dimension of the sheet (1 or w), and more preferably, 1% or less. For example, for a sheet of 1 cm in length l and in width w, a preferred layer thickness x is less than 1 mm, and more preferably less than 100 micrometers. This provides a much improved capacitor over those having anodes of bulk sponge or large sintered masses of sponge particles. Although the bulk sponges and sintered masses may have a high surface area, they have long electrical transport paths and high series resistance. Using a thin layer provides short electrical transport paths, even when the individual pore paths are relatively tortuous.

Figure 6:
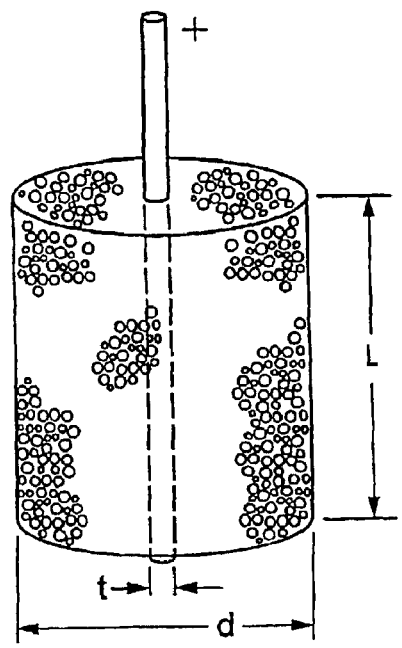
FIG. 6 is a schematic view of an anode formed from a slug of sintered particles for comparison with capacitors of the present invention.

The properties of capacitors formed with interleaved sheets of porous particles or solid particles sintered onto the substrate, as shown in FIG. 2, were compared with those of a capacitor formed with a sintered cylinders of the porous or solid particles, as shown in FIG. 6. For a given capacitor volume, the capacitor anodes made from multiple sheets have lower resistance than that of corresponding sintered cylinder capacitors and the power is correspondingly larger. Conventional capacitors have power densities of less than 10 kW/cm$^3$, whereas the capacitors of the present invention have much larger power densities.

For a capacitor employing an inter-leaved anode of height h, as shown in FIG. 2, and having n sheets, each with a width w and a length l, the resistance of the electrolyte is given by the expression:

$$R_{electrolyte} = \frac{h\rho}{4n^2 wl}$$

where $\rho$ is the resistivity of the electrolyte.

For example, for a stack of 5 layers (n=5), a height h of 0.5 cm, a sheet width w of 0.5 cm and length l of 1 cm, and a resistivity $\rho$ of 150 $\Omega$·cm, $$R_{electrolyte} = \frac{0.5 \times 150}{4 \times 25 \times 0.5 \times 1} = 1.5 \ \Omega$$

Such a capacitor has a volume of 0.25 cm$^3$ and a power of 60 kW at 300 V. When the number of sheets is increased to 100, spaced 0.1 mm apart, and having a width of 1 cm and length of 1 cm, a capacitor of 1.0 cm$^3$ can be formed which has a resistance $R_{electrolyte}$ of 0.00375 $\Omega$ and power of 24 MW at 300 V.

By way of comparison, for a capacitor employing a cylinder-shaped slug of sintered particles of length L and diameter d formed on a wire of thickness T, the resistance of the electrolyte $R_{electrolyte}$ is determined from the equation:

$$R_{electrolyte} = \rho \cdot \log_e(d/T)/2\pi L$$

where $\rho$ is the resistivity of the electrolyte. When d is 0.5 cm, T is 0.1 cm, L is 1 cm, and $\rho$ is 150 $\Omega$cm, then $R_{electrolyte}$ is 41 $\Omega$. Such a capacitor has a volume of about 0.25 cm$^3$, but a power of only 2.2 kW. Increasing the size of the cylinder to one of diameter 1 cm increases the $R_{electrolyte}$ and decreases the power to only 1.5 kW.

Thus, it can be seen that capacitors of high power can be achieved using multiple sheets formed from layers of particles on a substrate, while maintaining a small capacitor volume. Although capacitors formed from a single bulk ceramic piece, or slug, can be produced with high dielectric constants (up to around 12,000) the dielectric strength of such capacitors is much lower, typically less than 3% of the dielectric strength of the capacitors of the present invention. For example the present capacitors can be readily formed with dielectric strengths of 7.5 MV/cm, as compared with typically less than 0.2 MV/cm for the capacitors formed as a bulk ceramic piece. The bulky capacitors have a tendency to overheat and break down. In contrast, the capacitors of the present invention generate low thermal energy. Further, they have the capacity to self repair, as will be described in further detail herein.

Preferably, the particles 18 have a diameter of between 0.1 micrometer and 500 micrometers. The thickness x of the layer 16 is preferably between 10 and 500 micrometers. However, the preferred thickness x of the layer 16 depends on the desired power and energy requirements of the capacitor. When high power is sought, a porous layer 16 which is only about 1 particle layer in thickness is preferred. When high energy density is sought, a thicker layer is used. Generally, a compromise is sought between power and energy density and a porous layer of less than about 100 times the smallest particle diameter is often an optimal choice.

The optimum particle size is dependent on the pore size (in the case of porous particles) or smallest particle dimension (in the case of solid particles) and on the thickness of the dielectric.

For solid particles, the preferred particle size increases as the selected dielectric film thickness increases. Preferably, the smallest dimension of the solid particle preferably between 5 and 1000 times the pore size. As the layer is always at least one particle in thickness, the selected layer thickness defines the maximum size of the particle.

For example, for particles formed from sponge having a pore size of 3 micrometers, the dielectric film is about 400 nanometers in thickness, the particles 18 are preferably 10–300 micrometers in diameter, and the layer 16 of particles is preferably between 50 and 300 micrometers in thickness (i.e., at least one particle thick, and up to about 30 particles in thickness).

Where the pore size is smaller, the preferred size of the particles is smaller and the porous layer thickness correspondingly smaller. For example, for particles formed from sponge having a pore size of 0.1 micrometers, the dielectric film is about 10 nanometers in thickness, the particles 18 are preferably 1–100 micrometers in diameter and the layer 16 of particles is preferably between 10 and 100 micrometers in thickness (i.e., at least one particle thick, and up to about 100 particles in thickness).

Preferred sponge particles have the following characteristics:

1) A surface extensively covered with pores 60.
2) Pores 60 which are deeper than they are wide.
3) A porosity in the interior of the particle which is mostly accessible from the exterior of the particles.
4) Pores 60 may be interconnected.
5) The pores 60 are of varying width and length. Preferably, the pores are wider near the surface of the particle and narrower towards the interior of the particle. 6) Pores 60 may have round, elliptical, polygonal, or irregular cross sections.
7) The particles 18 have a large surface area per unit volume.
8) The pores 60 have a sufficient width that they leave open channels after coating with a dielectric film.

The porous particles can have a variety of shapes, including, but not limited to, spheres, regular and irregular polygons, disks, rods, needles, branched rods or needles, two- or three-dimensionally grown particles, such as dendritic particles, agglomerated particles formed from more than one particle, and other irregular shapes. Solid particles may have similar shapes to those of porous particles, but without pores.

Suitable materials for the particles are those which form an oxide which is a good dielectric. Examples include titanium, aluminum, tantalum, niobium, zirconium, vanadium, chromium, silicon, germanium, lead, palladium platinum, rhodium, or alloys of these metals. Titanium is a particularly good material for the particles. It is lighter and cheaper than tantalum. Additionally, titanium oxide has an energy density approximately 100 times that of aluminum or tantalum oxide. Particularly preferred alloys include: Ti—Zr, Ti—Nb, Zr—Ta, Ti—Hf, Ti—Ta, Ti—Be, Ti—Mg, Ti—Ca, Ti—Ba, Ti—Sr, and combinations of Ti—Zr, Ti—Nb, Zr—Ta, Ti—Hf, Pb—Zr—Ti, and Ti—Ta with Be, Mg, Ca, Ba, and Sr. Other conductive materials which do not form good dielectrics, such as copper may also be used, and coated with a suitable dielectric.

Particle Formation

Metal particles can be made by any known method, including condensation from a gas phase, atomization from a liquid phase, crushing of a solid, and chemical methods of making metal powders from metal compounds, such as hydrides, borides, carbides, nitrides, oxides, and halides, or from mixed compounds, such as hydroxides, borates, sulfates, carbonates, nitrates, phosphates, and ammonia compounds of metals. The compounds are readily converted into the pure metal form and can be made into particles by precipitation from a supersaturated solution, or by crushing of solid pieces.

Solid particles may be used in their as-produced shape. Alternatively a mixed metal alloy may be formed and one of the alloy phases removed by etch-removal to form a particle with an increased surface area. Other methods of particle formation include:

1) Formation of Particles from a Metal Mixed with an Insoluble Phase.

In this method, molten droplets are solidified from a well mixed liquid formed by heating the metal for the particles with a second phase to a temperature at which both the metal for the particles and the second phase are liquid. The second phase is one which is insoluble in the solid metal for the particles selected. In the liquid state, the second phase is miscible, either naturally or by agitation, with the liquid metal for the particles. The liquid mixture of mutually insoluble materials is allowed to cool. It may be subjected to freezing temperatures to speed solidification. Upon solidification of the droplets, heterogeneous solid particles are obtained with a porous metal microstructure with the second phase residing in the pores. The second phase is removed from the pores of the particles, for example by leaching or distilling. It may be an element, or a salt. The method is particularly suited to the formation of aluminum sponge particles. The particles formed are used to form the capacitor anode. Preferred second phase materials are alkali metals for Al particles, and alkali earth metals for Ti particles. Table 1 lists combinations of materials for forming the particles by this method.

The higher the cooling rate the finer will be the pore structure and the greater will be the sponge particles' surface area per unit substrate area. For example, a mixture of aluminum and potassium solidifies as aluminum sponge particles with the pore spaces consisting of potassium. The potassium can be removed, for example, by vacuum distillation leaving aluminum sponge particles.

For the solidification process, the metal for the sponge particles preferably has a melting point which is below about 1,700° C., and more preferably below 1200° C., for ease of processing. Preferably the metal used for the sponge particles also has a stable oxide which is a good dielectric material, as will be discussed later. Optionally, the metal may be an alloy with one or more of the following elements:

Be, Mg, Al, Si, Zn, Ga, Ge, As, Se, Cd, In, Sn, Sb, Te, Tl, Pb, Bi, and rare earth elements, so long as the alloys form stable oxides that are suitable for dielectric films.

TABLE 1

Materials from which Fine Solidification Structures may be made for Capacitors

| Elements for sponge particles | Second Phase Removed From Solidified Structure | Dielectric |
|---|---|---|
| Al, Mg, Sn, Pb, Zn, Cu, Ag, Si, Ge, Sb, Te, Tl, Bi, and rare earth elements with melting points below about 1200° C. | Na, K, Rb, or Cs | $Al_2O_3$, MgO, etc. |
| Alloys of Mg, Al, Si, Zn, Ga, Ge, As, Se, Cd, In, Sn, Sb, Te, Tl, Pb, Bi, provided the alloy forms a stable oxide | Na, K, Rb, Cs | Mixed oxides |
| Ti Ti-Be alloy | Ca, Sr, Ba | $TiO_2$ or $TiO_2.BeO$, $TiO_2.CaO$, $TiO_2.SrO$, $TiO_2.BaO$, respectively |
| Zr, Hf, V, Nb, Ta, Cr, Mn, Fe, Co, Ni | Ca, Sr, Ba | Forming own oxide or coated with another dielectric |
| Ti and Zr, Hf, V, Nb, Ta, Cr, Mn, Fe, Co, Ni, Be | alkali or earth alkali halides | Forming their own oxide or coated with another dielectric |

2. Particles Formed by Conversion of Metal Compounds to the Corresponding Metal

Figure 7A:
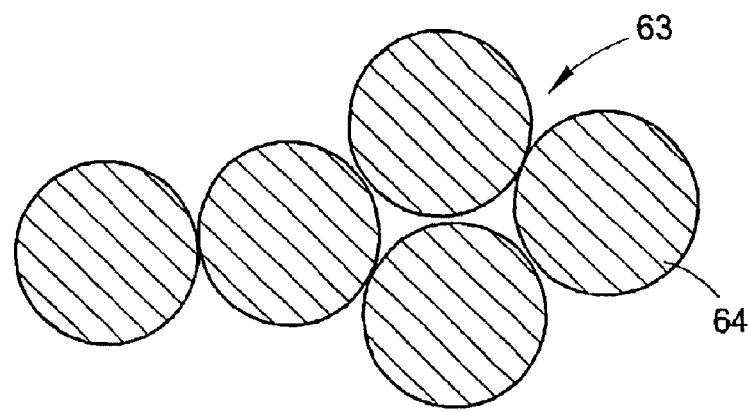
FIG. 7A shows a layer of particles prior to oxidation.
Figure 7B:
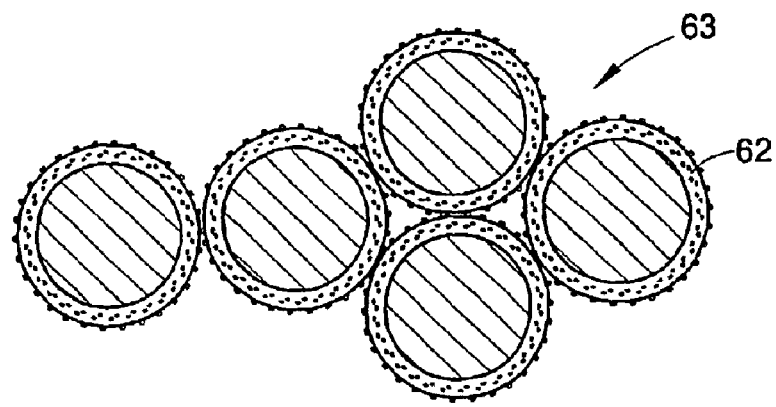
FIG. 7B shows the layer after oxidation.

This method involves the conversion of a compound of a metal by reduction to the corresponding metal. The decrease in volume which is associated with the conversion results in the formation of fine pores throughout the particles. In a first step a compound, such as an oxide scale 62, is grown on a layer 63 of particles 64 formed from a suitable metal substrate, as shown in FIGS. 7A and 7B. The particles may be sintered to form the layer prior to growth of the compound.

Figure 7C:
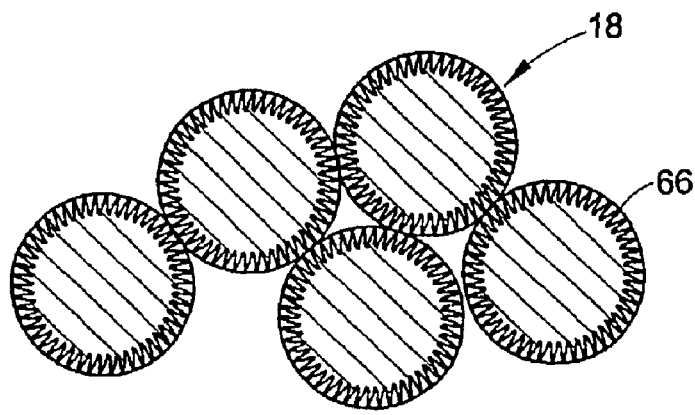
FIG. 7C shows the layer after reduction of the oxidized layer, leaving the particles with a porous surface.

Suitable substrate metals for the particles include Ti, Ta, or alloys of Ti—Ta, Ti—Zr, or Ti—Be. The metal is one which can form a compound 62 having a Pilling-Bedworth ratio of greater than 1. When this is the case, the molecular volume of the compound 62 produced is greater than the volume of the metal from which the compound is formed. Consequently, volume shrinkage and pores 66 result when the compound is reduced to the corresponding metal and the byproduct of the reducing reaction is removed, as shown in FIG. 7C. FIG. 7C shows the result when only an outer portion 62 of the particle 18 is converted to the scale and then reduced. Greater porosity may be achieved by converting the entire particle to the corresponding compound prior to reduction.

In an alternative embodiment, the particles 18 may be separately oxidized and reduced to provide their porosity prior to formation of the layer 63. The layer of porous particles 18 can then be sintered or otherwise joined together to maintain electrical contact therebetween in the layer.

As discussed above, the layer 63 of particles may be freestanding (as shown in FIG. 4), formed on a suitable substrate 40 (as shown in FIG. 3), and/or include reinforcing members 54 as shown in FIG. 5).

When the compound is an oxide, it is reduced to the corresponding metal with a suitable reducing agent, usually at an elevated temperature. For oxides of the metals Ti, Ta, Zr, Be, or their alloys, one or more of the reducing agents Li, Mg, Ca, Ba, Sr, and hydrogen are effective. The reducing agent is preferably in the form of a gas or liquid.

The compound used as the starting material may be in the form of particles such that, upon reduction, sponge particles are obtained. Alternatively, the compound starting material is a polycrystalline scale grown on a suitable substrate, such as an oxide scale having variously oriented crystallites on a substrate of the corresponding metal. Alternatively, the compound is in the form of a layer which has been coated on to the surface of a substrate, for example, by sintering. Upon reduction, the scale or coating is converted to a layer of metal sponge with pores of varying orientations. The pores contain the byproduct of the reducing reaction, namely, the oxide of the reducing agent, for example, water vapor in the case of hydrogen and calcium oxide in the case of calcium. Solid oxides, such as CaO, may be leached out, for example, with water or an acid, such as acetic acid. In the case of water as the oxide, the water is preferably carried off as vapor. The remaining metal sponge particles have similar physical properties to the particles prepared by the first method. The particles have a high surface area with a readily accessible open porosity.

For example, tantalum oxide may be reduced to tantalum sponge particles at high temperature in the presence of hydrogen as follows:

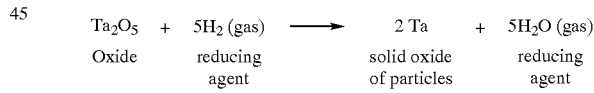

$Ta_2O_5$ + $5H_2$ (gas) → 2 Ta + $5H_2O$ (gas)
Oxide    reducing agent    solid oxide of particles    reducing agent A volume change takes place such that 1 cm³ of $Ta_2O_5$ is transformed to 0.4 cm³ of Ta. The difference in volume results in the porosity of the Ta.

Similarly, a titanium oxide scale may be reduced to titanium sponge particles with calcium as follows:

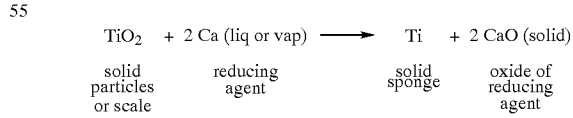

$TiO_2$ + 2 Ca (liq or vap) → Ti + 2 CaO (solid)
solid particles or scale    reducing agent    solid sponge    oxide of reducing agent The volume change in this case is 1 cm³ $TiO_2$ to 0.58 cm³ Ti. The CaO remaining in the pores of the Ti sponge particles formed is leached out with a leaching agent to produce clean sponge particles. Suitable leaching agents include water and acid.

Alloyed metal sponge particles or doped metal sponge particles may also be formed by this process.

The density of the oxide scale contributes to the directionality of the resulting pores. When a fully dense oxide scale is grown and then reduced, the sponge produced tends to be directional because the reduction occurs essentially in one direction, from the outside of the scale inward toward the substrate. When a non-dense oxide scale is grown and then reduced, it is likely that the metal sponge produced is non-directional, or partially directional, because the reducing agent can penetrate into the oxide scale's pores and from there react with the grains of the oxide. The direction of the reduction reaction will be from the oxide grain surfaces inward into the oxide grains. The variation in oxide grain orientation and variations in the orientation of the reacting grain surfaces makes the sponge's growth direction unpredictable, i.e. the sponge is non-directional.

3) Chemical Method for Growth of Porous Particles from a Vapor

Dendritic sponge particles may be grown by reduction of a vapor of a compound of the metal to the corresponding metal in a process which allows the growth of sponge particles at suitable nucleation sites in a manner similar to the growth of a snowflake on a particle of dust. The nucleation sites may be provided by minute particles of metal or dust-like particles of other materials, which are preferably much smaller in size than the resulting sponge particle. The nucleation sites therefore need not contribute to the overall properties of the resulting particles.

For example, a metal halide in vapor form is reduced by a reducing agent, preferably an alkali or earth alkali metal, such as magnesium or sodium, such that the dendritic sponge particles of the reduced metal are separately formed at nucleation sites. The metal halide is one which is gaseous at the reaction temperature. Several metal halides have been found to be suitable. These include chlorides, fluorides, and iodides of titanium, aluminum, tantalum, niobium, zirconium, vanadium, chromium, silicon, germanium, and mixtures of these. For example, in the case of titanium sponge particles formed by the reduction of titanium chloride with magnesium, the formation process can be described by the following equation:

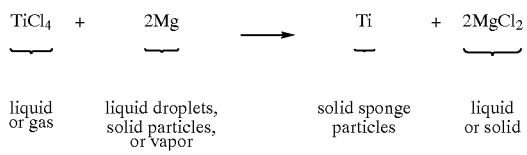

The reaction products are titanium sponge particles and magnesium chloride, which may be liquid or solid, depending on the temperature used.

Because of the coexistence of the two reaction products, in this case titanium and magnesium chloride, the sponge particle morphology that develops consists of titanium dendrites with magnesium chloride residing in the interdendritic spaces. The magnesium chloride, or other alkali metal halide, is removed by draining and vacuum distillation, or by leaching. Vacuum distillation ensures that residual traces of magnesium chloride are removed so that they do not contaminate the sponge particles. Preferably, the distillation is carried out at between 800 and 1200° C. at a high vacuum to ensure complete removal of the alkali metal halide.

Magnesium and sodium are particularly preferred reducing agents, with sodium being the most preferred because of the easier removal of sodium chloride. Additionally, using sodium as the reducing agent allows selection of the level of coarseness or fineness of the sponge. Very fine sponge particles can be made at a relatively low temperature (600–700° C.). Other metals which can be used as reducing agents include zirconium and vanadium.

Mixed metal sponge particles may also be formed by this process. For example, Ti—Zr alloy sponge particles may be formed by the reduction of a mixture of $TiCl_4$ and $ZrCl_4$ with an alkali (A) or earth alkali (EA) element. The sponge particle synthesis process proceeds by the reaction:

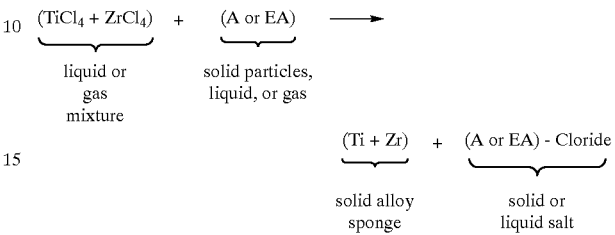

A specific example for forming sponge particles of 50 atom % Ti and 50 atom % Zr alloy using potassium as the reducing element is:

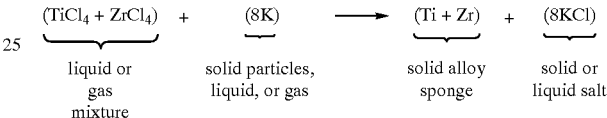

Figure 8:
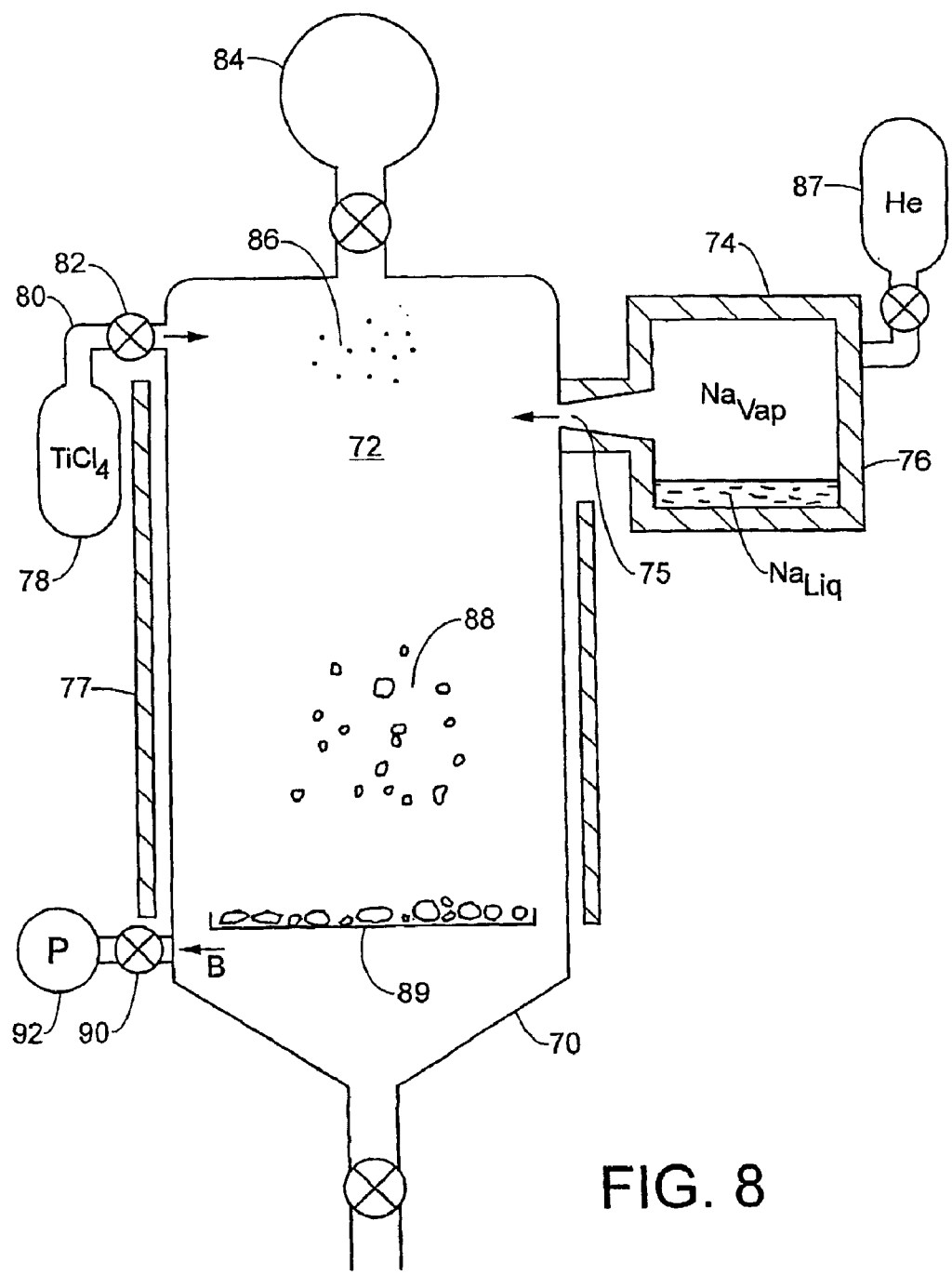
FIG. 8 is a schematic view of a processor for forming porous sponge particles, according to the present invention.

FIG. 8 shows a suitable apparatus for forming the particles. The process is described with particular reference to the formation of titanium sponge particles by reduction of titanium chloride with sodium. It should be appreciated, however, that the process is also suited to the formation of other metal sponges with different reducing agents. The process conditions will vary, depending on the vapor pressure of the reducing metal, and other reaction variables.

A reaction vessel 70 for carrying out the sponge particle formation process defines a chamber 72. A reservoir 74, connected with the chamber via an injection nozzle 75 contains sodium, or other reducing metal, to provide a vapor pressure of the reducing agent (e.g. Na vapor) within the chamber. The vapor pressure generated in the reservoir is dependent on the temperature of the reservoir. For example, at 530° C., the vapor pressure of sodium is $10^{-2}$ atmospheres, and at 883° C., it is 1 atmosphere. A heating source 76 surrounds the reservoir for heating the reservoir to a suitable temperature for providing the vapor. A second heating source 77 surrounds the reaction chamber to heat the chamber and maintain the chamber at a suitable reaction temperature. For a sodium reducing agent, a suitable chamber temperature is in the range of 500 to 900° C., although other temperatures can also be used.

Once the desired chamber temperature has been achieved, a source 78 of a halide of the sponge particle material, such as a source of titanium chloride, supplies titanium chloride to the chamber through an inlet line 80. An inlet valve 82 in the inlet line 80 allows the rate of introduction of titanium chloride to be regulated. A source 84 of nucleation material supplies nucleation sites 86 to the chamber. The nucleation sites may be eliminated if a fine mist of sodium is provided which itself acts as nucleation sites. At the temperature and pressure of the chamber, the titanium chloride is in the form of a vapor which is reduced by the sodium at the surface of nucleation sites.

In one preferred embodiment, the sodium vapor generated in the reservoir 74 is at a higher pressure, and preferably, a higher temperature, than that of the chamber 70. The pressure difference may be provided by heating the sodium to a sufficient temperature to produce a vapor pressure which is higher than the pressure within the chamber, or by adding an inert carrier gas to the reservoir, such as helium or argon, from a source of the carrier gas 87. Injection of the sodium vapor (and optionally the carrier gas) into the chamber is therefore accompanied by a rapid drop in pressure and a decrease in temperature of the sodium vapor. The drop in temperature and pressure is sufficient to cause the sodium vapor to condense as a fine mist of sodium droplets which then react with the titanium chloride gas to form small titanium sponge/NaCl particles. Outward-growing dendritic sponge particles 88 of titanium dendrites with sodium chloride in the interdendritic spaces (pores) form from these small particles in the chamber.

The inert gas in the injected vapor acts as a heat sink in the chamber, which is beneficial for maintaining a controlled temperature within the chamber 70. Otherwise, heat produced by the exothermic reaction between the titanium chloride and sodium can cause over-heating of the particles.

The exact microstructure of the sponge particles will depend on the number of the nucleation sites and on the processing parameters, namely the vapor pressure of sodium, $P_{Na}$, the vapor pressure of titanium chloride, $P_{TiCl4}$, and the reaction temperature. If the dendrites were to grow in all directions at an equal rate from a single nucleation site, then spherical particles would be obtained. In practice, however, the rate of growth is not uniform in all directions and a variety of particle shapes, similar to the variety found in snowflakes, tends to result. For example, when a sodium droplet acts as the nucleation site, dendrite growth is primarily tangential to the droplet surface.

The forming particles are kept suspended in the chamber by mixing of the vapor and particles. Preferably, the particles are remain suspended in the chamber until they have grown to a sufficient size, at which time they settle under gravity on to a collection tray 89 or as a powder layer on a substrate. Alternatively, they may be withdrawn from the chamber in the direction of arrow B through an outlet 90 as they are formed. Alternatively, or additionally, a pump 92, connected with the outlet recirculates gases withdrawn from the chamber.

Figure 9:
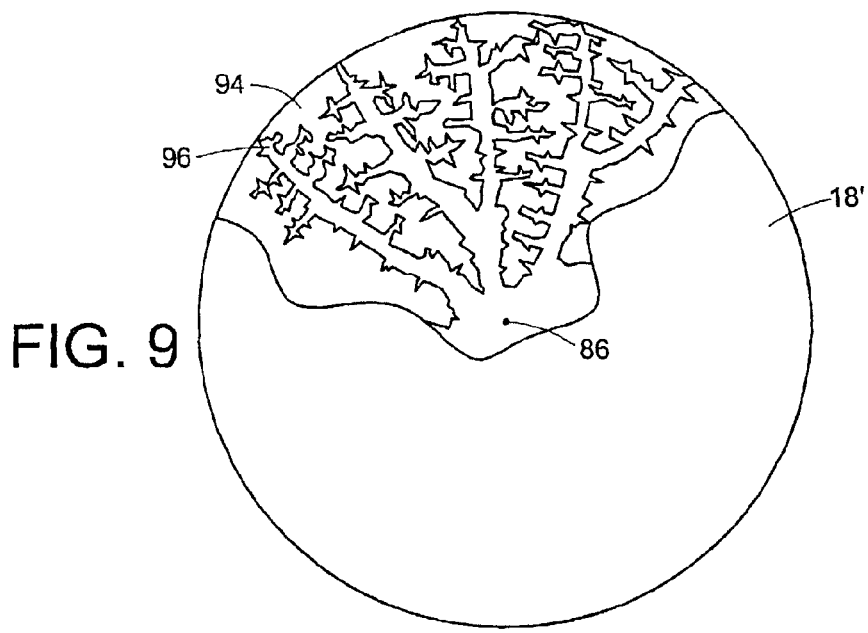
FIG. 9 is a greatly enlarged cross sectional view of a porous sponge particle formed by the processor of FIG. 8.

FIG. 9 shows a schematic diagram of a dendritic sponge particle 18' formed by this process, prior to removal of the interdendritic material 94 (NaCl in the example), showing the dendrites 96 growing away from the nucleation site 86.

Chamber temperatures of 100–1,000° C. are suitable for the formation of titanium sponge particles in this manner. A particularly preferred temperature is below 800° C., most preferably, around 700° C. The rate of growth and shape of the dendritic sponge particles is dependent on the temperature. At lower temperatures, the dendrites are fine with large surface areas. However, the growth rate is relatively slow. At higher temperatures, the growth is much faster, but the dendrites are wider and thus have a smaller surface area to volume ratio. Thus the surface area of the sponge particles can be selected for the desired properties of reaction surface. The rate of growth and shape of the particles is also dependent on the concentration of the reactants. At low reactant concentrations, fine dendrites are grown relatively slowly, whereas at higher concentrations, the dendrites are wider, with lower surface areas.

Once growth of sponge particles of a suitable size has been achieved, the unwanted reaction product, sodium chloride in this case, is removed by vacuum distillation or other suitable methods.

The time needed for distillation depends on temperature and on the length and width of the gas diffusion paths from the interdendritic regions. The vapor pressure of sodium chloride $P_{NaCl}$ (in atmospheres) is given by the following equation:

$$\log(P_{NaCl})=-12{,}440T^{-1}-0.09 \log T-0.46 \times 10^{-3}T+11.43$$

where T is the temperature in degrees Kelvin. The vapor pressure of sodium chloride ranges from $4 \times 10^{-5}$ to $1.9 \times 10^{-2}$ atmospheres in the 800 to 1,000 degree temperature range. Complete removal of the sodium chloride by vacuum distillation is thus readily achieved.

Formation of an Electrode from the Particles

The following procedures may be used to form the anode, the cathode, or both. The porous layer 16 can be formed as a continuous self-supporting layer 50 of particles, as shown in FIG. 4, be sintered to sheet supporting members 54 to form a layer 52, as shown in FIG. 5, or formed by sintering or otherwise adhering particles 18 on to a suitable substrate, as shown in FIGS. 1–3.

The particles may be solid particles, or they may be porous particles of sponge, grown by the methods described above. In one embodiment, solid particles are adhered to the substrate and then oxidized and reduced as described above to form porous, sponge particles on the substrate. For example, finely ground titanium dioxide is mixed with a binder and painted onto a suitable substrate as a thin layer. The substrate and layer are heated to evaporate the binder and then the titanium oxide is reduced with calcium, or other suitable reducing agent, to form a titanium sponge particle from each of the grains of titanium dioxide.

Self supporting sheets 50 of particles 18 may be formed, for example, by sintering particles 18 together or by reduction of a continuous oxide scale, either free standing, or on the surface of a metal by the methods described above.

The sheet supporting members 54 may be in the form of fibers, wires, flakes or other material shapes which provide mechanical stability to the substrate. The members are preferably formed from an electrically conductive metal, such as those typically used to form solid anodes, or from another electrically conductive material, which, upon anodization of the anode to form the dielectric film 36, develops an oxide film with a dielectric strength that is as high or higher than that of the dielectric film.

As shown in FIG. 5, the supporting members preferably have their longest dimension oriented parallel with the surface of the layer 52. In this way, they provide improved mechanical stability and increased electrical conductivity in the plane of the layer.

Preferably, where a substrate 14 is present the thickness x of the porous layer 16 is from about 1 to 10 times the thickness t of the supporting substrate.

The Dielectric Film

The dielectric film 36 may be formed in a number of ways. While particular reference is made to forming a dielectric film on anodes formed from a layer if particles, it is to be appreciated that the same techniques may also be used for forming dielectrics on anodes formed from thin sheets of metal or formed from a continuous layer of a sponge material, as will be discussed in further detail later.

In one preferred embodiment, the dielectric film is readily formed by anodizing the surface of the particles 18 to create a thin dielectric film over the entire surface of the particle layer 16. The dielectric film in this case comprises an oxide of the metal or metals used in forming the particles. Anodization may be carried out after the particles are formed into a layer on the substrate.

Alternatively, a second material for the dielectric may be laid down over the particles, such as an oxide, ceramic, or polymer.

Table 1 lists oxides suitable for use as dielectric films. A particularly favored dielectric material is titanium dioxide, due to its high energy density (2250 J/cm$^3$), roughly 100 times greater than that of aluminum oxide or tantalum oxide when formed by anodizing the base metal. Titanium dioxide-based dielectrics having high dielectric constants (greater than 25) and high dielectric strength (greater than 1 MV/cm) may be formed on both pure titanium particles and on particles of doped or alloyed titanium. Suitable metals for forming doped and alloyed titanium particles with good dielectric oxide films include Zr, Ta, Be, Mg, Ca, Sr, Ba, Pb, Pd, Pt, Rh, V, and Al. By careful selection of the doping metal or metals, significant improvements in the properties of the dielectric can be obtained. For example, undoped $TiO_2$ has a dielectric constant of about 150 and a dielectric strength of about 7.5 MV/cm for anodically grown $TiO_2$, whereas Ca-doped $TiO_2$ has a dielectric constant of over 500.

In a first method for forming the dielectric, the oxide film is grown by anodizing the porous layer 16 of particles. The thickness of the oxide film is controlled by selecting the voltage applied. The thickness of a titanium oxide film is approximately 1.33 nanometers per volt. Thus, at 300 volts, a thickness of 400 nanometers is anticipated. The oxide film is formed as a layer of uniform thickness.

To form the oxide layer by this method, the porous layer 16 is immersed in a suitable electrolyte and a set DC voltage applied, depending on the desired film thickness. The electrolyte contains an oxidizing agent, such as an alkali or earth alkali phosphate, sulfate, borate, or silicate, or is an acid electrolyte. The electrolyte preferably has an electrical resistivity of less than 500 Ohm·cm.

Particularly in the case of sponge particles, the layer is subjected to a vacuum prior to infiltration of the electrolyte to remove air bubbles which could inhibit penetration of the electrolyte into the fine pores of the particles 18.

Suitable electrolytes include alkali and earth alkali phosphates, sulfates, silicates, and borates, and the corresponding acids. Preferred oxidizing agents include sulfuric acid ($H_2SO_4$), phosphoric acid ($H_3PO_4$), sodium phosphate ($Na_3PO_4$), and sodium silicate ($Na_2Si_2O_5 \cdot xH_2O$) at a concentration of 0.1 to about 10% in distilled water.

Other suitable electrolytes include oxalates and acetates, such as alkali and earth alkali oxalates, acetic acid, and acetates, for example, lithium acetate and beryllium acetate.

The electrolyte may be mixed with an additive form a doped oxide dielectric. Suitable doping additives include $Ca_3(PO_4)_2$, $CaHPO_4$, $BaSiO_5$, $BaSi_2O_4$, which form titanate oxides of Ti—Ca and Ti—Ba, respectively, when used with a titanium layer of particles.

Optionally, the electrolyte also includes an organic solvent for reducing the leakage current of the dielectric. Examples of suitable solvents-include ethanol, methanol, and acetone, alone or in combination. For example, electrolytes containing 15% ethanol, 15% methanol, 3% acetone, and 66% water, in addition to an oxidizing agent, were found to be effective. For titanium dioxide, in particular, additions of such solvents reduce leakage current by a factor of about 5.

In a second method, the dielectric film is grown by thermal oxidation. In this method, an oxidizing atmosphere which includes gaseous oxygen is used. The oxygen penetrates readily into the layer and into the pores of the particles (where porous) for growth of a continuous oxide film. At relatively low temperatures (less than 600° C.), oxide films of anatase are obtained on a titanium layer. At higher temperatures, rutile films are formed. The rate of growth of the film is dependent on the temperature and on the pressure of oxygen. Oxygen pressures of greater than $10^{-6}$ atmospheres are effective for growth of a titanium oxide film on titanium. The oxygen pressure can be as high as the strength of a containing vessel will permit, typically up to about 10,000 atmospheres. Preferably the oxygen atmosphere is free of nitrogen. The presence of nitrogen results in contamination of the oxide film and high oxygen vacancy concentrations which tend to lead to leakage of current in capacitors formed from the particles. The oxygen vacancy concentration is reduced by excluding nitrogen and also by selective doping of the film.

Alloyed oxide films may also be formed by introducing a second metal during formation of the oxide. For example, a $CaO/TiO_2$ mixed oxide or calcium titanate film is formed by admitting calcium vapor into the heated chamber after formation of a titanium oxide film. The calcium reacts with the titanium oxide to form CaO and Ti. Upon renewed admission of oxygen, an alloyed oxide film of CaO and $TiO_2$ is formed. Alternatively, an anode which consists of a solid solution of titanium and oxygen is heated in the presence of calcium vapor. As the calcium comes into contact with the heated titanium anode, it reacts with the oxygen in solution to form a CaO surface film. Oxygen diffuses out of the solid solution to the surface of the anode where reaction with calcium leads to growth of the CaO film. On renewed admission of oxygen, an alloyed oxide film is formed between titanium oxide and calcium oxide. An alloyed oxide film may also be formed by anodization of a titanium anode coated with a CaO film. A temperature of about 600 to 900° C. is sufficient to maintain a vapor pressure of calcium for forming the CaO film.

Other titanate formers, such as Mg, Sr, Be, and Ba may be similarly used to form alloyed oxide films or titanates. The vapors of the titanate formers aid in drawing out oxygen which has dissolved in the titanium lattice. The titanate former is optionally added step-wise, with additional introductions of oxygen between each addition.

Alternatively, for oxide films produced by immersion of the layer 16 in an electrolyte, a salt of the alloying oxide, such as a Mg, Ca, Sr, Be, or Ba salt, is optionally added to the electrolyte in order to form titanium oxide alloyed with these elements. Dielectric constants for alloyed films are higher than for pure titanium oxide films, and may be up to around 12,000.

The properties of the dielectric can be modified further by doping the oxide film with other materials. In the case of titanium oxide, for example, the dielectric properties have been found to vary considerably with the inclusion of small amounts of dopants. For example, good dopants for titanium oxide include higher valent cations, primarily pentavalent and hexavalent cations, such as $Cr^{6+}$, $V^{5+}$, $Ta^{5+}$, $Mo^{6+}$, $Nb^{5+}$, $W^{6+}$, and $P^{5+}$, as well as the titanate formers Sr, Mg, Ca, Ba, and Be, as discussed above. Only a small amount of the dopant is needed to provide improved dielectric properties, for example, amounts of up to about one percent of these dopants can provide a ten-fold improvement in the dielectric constant. For example, undoped $TiO_2$ has a dielectric constant of about 150 and a dielectric strength of about 7.5 MV/cm for anodically produced $TiO_2$. $TiO_2$ doped with a small amount of Ca (0.3% Ca) has a dielectric constant of 900, with little or no decrease in dielectric strength as compared with an undoped $TiO_2$.

Certain dopants reduce oxygen vacancy concentration in the dielectric, resulting in reduced current leakage from the capacitor. For example, with titanium oxide, lattice defects tend to occur in the form of oxygen ion vacancies. These, along with grain boundaries are the most likely facilitators of leakage current. Doping with pentavalent or hexavalent cations decreases the oxygen vacancy concentration.

The dopant may be added either before, during, or after formation of the oxide film. For example, when using the anodizing process to form the oxide film, doping may be done by providing a higher valent cation in the electrolyte so that the cation is incorporated into the growing titanium oxide film where it reduces the oxygen vacancy concentration. Salts of Ca, Ba, and the like, may also be added to the electrolyte. For example, $CaHPO_4$ may be added to an 0.2% $H_2SO_4$-1% $H_3PO_4$ electrolyte. By saturating the electrolyte with the $CaHPO_4$, calcium concentrations as high as about 0.3 atom % may be achieved in a titanium oxide film. Such concentrations are effective for reducing the leakage current from the oxide film and increasing the dielectric constant as compared with a pure oxide. For example, a titanium oxide film doped with 0.3 atom % calcium had a leakage current of 40 micro-amperes/cm$^2$ and a dielectric constant of 900, as compared with a leakage current of 200 micro-amperes/cm$^2$ and a dielectric constant of around 165 for the undoped oxide.

Alternatively, the surface layer of titanium particles may be alloyed or doped before oxidation. Table 2 lists the vapor pressures (in units of atmospheres) of several elements suitable for oxide alloying.

$$Energy = \frac{1}{2}CV^2$$

$$and\ Energy\ Density = \frac{1}{2}\epsilon\,[V/X]^2$$

where $\in$ is the dielectric constant and V/X is the dielectric strength.

Capacitor Electrolytes

The electrolyte 24 preferably serves two functions. One is to collect and conduct electrical charge, i.e., it serves as the cathode for the capacitor. The second function of the electrolyte is to enable spontaneous repair of the dielectric film in the event of local breakdown of the film. To serve as a repair agent, the electrolyte is maintained in intimate contact with the dielectric film throughout the capacitor volume. This contact is preferably achieved by vacuum-infiltration of the electrolyte, and may be further improved by exerting external pressure on the electrolyte bath.

A number of materials form suitable capacitor electrolytes. The electrolyte may be liquid or solid. Liquid electrolytes include low-melting alkali metals saturated with dissolved oxygen. Other preferred liquid electrolytes are aqueous solutions of oxidizing agents, such as phosphates, sulfates, silicates, and borates of alkali and alkali earth elements, or phosphoric, sulfuric, acetic, oxalic, or boric acid, as described above for the electrolyte used for forming the dielectric. Examples include $H_2SO_4$, $H_3PO_4$, $Na_3PO_4$,

TABLE 2

Vapor Pressures (in Atm) of Earth Alkali Metals as a Function of Temperature

| | 500° C. | 600° C. | 700° C. | 800° C. | 900° C. | 1000° C. |
|---|---|---|---|---|---|---|
| Magnesium | $1 \times 10^{-4}$ | $2 \times 10^{-3}$ | $9 \times 10^{-3}$ | $5 \times 10^{-2}$ | $2 \times 10^{-1}$ | $5 \times 10^{-1}$ |
| Calcium | $6 \times 10^{-7}$ | $1 \times 10^{-5}$ | $1.5 \times 10^{-4}$ | $1 \times 0^{-3}$ | $5 \times 10^{-3}$ | $1.5 \times 10^{-2}$ |
| Strontium | $5 \times 10^{-6}$ | $8 \times 10^{-5}$ | $7 \times 10^{-4}$ | $4 \times 0^{-3}$ | $1 \times 10^{-2}$ | $5 \times 10^{-2}$ |
| Barium | $3 \times 10^{-7}$ | $4.5 \times 10^{-6}$ | $2 \times 10^{-5}$ | $1 \times 10^{-4}$ | $8 \times 10^{-4}$ | $3 \times 10^{-3}$ |

Where the layer 16 is of a metal that does not readily form a good dielectric oxide film, the metal surface may be coated with a suitable dielectric. For example, particle layers from copper may be coated with plastic or ceramic, as the dielectric film.

In another preferred embodiment, the dielectric film is formed by sputter deposition. In this embodiment, a material for forming the dielectric is sputtered onto the layer 16 of particles to coat the layer with a thin film of the dielectric material. Suitable materials for forming the dielectric film are those having a high dielectric constant, and include titanates, such as $BaTiO_3$ and earth alkali titanates, mixed alloy oxides which include titanium, such as (Ta+Ti) oxide, (Nb+Ti) oxide, (Zr+Ti) oxide, and (Pb+Zr+Ti) oxide, and the like.

The sputter coated dielectric film thus formed is preferably subjected to an anodizing treatment to ensure complete continuity of the dielectric film. This can be done as described above, for example, by immersing the sputter deposited layer in an electrolyte and applying a voltage to grow the oxide to a suitable thickness and fill in any vacant spaces or defects. This additional anodizing step increases the dielectric strength of the dielectric film, resulting in a dielectric film of both high dielectric constant and high dielectric strength. As a result, the capacitors formed from the sputter-coated anode have high energy density, since:

and $Na_2\ Si_2O_5.xH_2O$. Other suitable electrolytes include acetic acid, oxalic acid, and their acetates, and oxalates, such as alkali and alkali earth acetates and oxalates. Lithium and beryllium oxalate and acetate are examples.

Solid electrolytes include $MnO_2$, which is particularly preferred for tantalum capacitors and is also suitable for titanium capacitors.

For titanium capacitors, in particular, low-melting alkali metals saturated with dissolved oxygen are particularly effective electrolytes. They provide high electrical conductivity and thus enable capacitors to have especially high power densities. Examples of such alkali metals include sodium, potassium, rubidium, and cesium. Eutectic alloys of these metals remain liquid at low temperatures (i.e. below common capacitor operating temperatures, which are typically around 0° C. and above). Eutectic alloys or near eutectic alloys between potassium and cesium are particularly preferred. For example, an alloy formed from a eutectic composition of 50 atom percent potassium (22.7 weight percent) and the balance cesium remains liquid to a temperature of −37.5° C. Alloys that vary in composition by plus or minus 20 atom percent, or less, from the eutectic composition are suitable liquid electrolytes from below 0° C. to up to about 300° C.

In addition to high electrical conductivity, the liquid metal electrolyte has the advantage of absence of solidification shrinkage voids which may occur in solid electrolytes such as $MnO_2$. The operating temperatures of eutectic K—Cs filled titanium capacitors, for example, range from −37.5° C. to over 200° C.

The liquid metal electrolyte is preferably saturated with dissolved oxygen by the incorporation of oxygen-rich compounds of thermodynamic stability lower than that of the oxide of the dielectric film. For example, liquid potassium saturated with potassium oxide precipitates contains 0.10 mass percent oxygen in solution at 100° C. and 0.27 mass percent oxygen at 200° C. (Smithells Metals Reference Book, 7th edition, edited by E. A. Brandes and G. B. Brook, Butterworth-Heinemann publisher, (1992) Table 12–19). For repair of titanium oxide dielectrics, oxide, phosphate, or silicate precipitates, such as those of Na, Cs, or K, may be included in the liquid metal electrolyte for additional oxygen reserves. These oxygen-rich compounds aid repair of the dielectric film by oxidizing the underlying titanium metal in regions where localized breakdown of the oxide layer has occurred. During a repair reaction, such precipitates are converted into the metal, such as metallic sodium or potassium. Because these oxide precipitates have Pilling-Bedworth ratios of less than one, their reduction results in a volume increase which enhances tight contact between the electrolyte and the dielectric film.

Doping additives may be added to the capacitor electrolyte for repair of mixed oxide dielectric films. Suitable doping agents include $Ca_3(PO_4)_2$, $Ca\,HPO_4$, $Ba_3SiO_5$, and $BaSi_2O_5$. These form titanates when used with titanium particles.

Anodes Formed from Sponges

Figure 10:
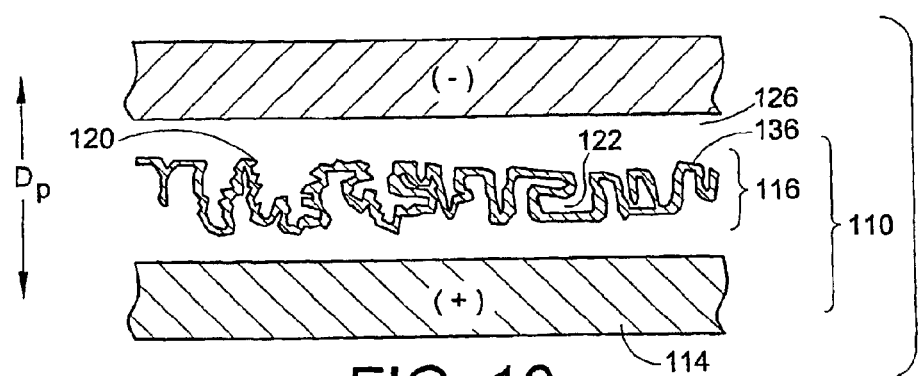
FIG. 10 is a sectional view of a capacitor according to a fourth embodiment of the present invention.

In an alternative embodiment shown in FIG. 10, an anode 110 includes a porous layer 116 of sponge which is grown on a surface of a metal substrate 114. The sponge formed may be directional, non-directional, or partially directional, depending on the conditions of formation. The porous layer of particles of FIG. 1 is thus replaced by a continuous sponge layer. By directional, it is meant that the sponge has pores which are generally aligned perpendicular to the surface of the substrate 114 or with the surface 120 of the porous layer 116 of sponge. By partially directional, it is meant that the layer has some regions where the pores are directional, but there are some areas of imperfection, for example caused by stresses during formation of the sponge which can lead to formation of pores 122, whose major axis deviates substantially from ideal, or perfect directionality $D_p$ (perpendicular to the surface of the substrate 114 or with the surface 120 of the porous layer 116 of sponge), as shown in FIG. 10. Non-directional sponges have very little, or essentially no ideal directionality, but nevertheless provide advantages over non-porous materials or bulk ceramics conventionally used as anode materials.

While greater directionality tends to provide shorter pathways and improved capacitor performance, allowing some or all of the resulting pores to be non-directional makes for less stringent processing requirements and reduced processing costs. By using only a thin layer of non-directional or of partially non-directional sponge, preferably less than 100, more preferably less than 50 pore widths in thickness, the lack of directionality of the pores does not significantly impair the characteristics of the capacitor, as compared with a predominantly directionally grown sponge layer. The surface of the porous sponge layer 116 is coated with a dielectric film 136 throughout its accessible pores, as for the porous layer 16 formed from particles. The substrate 114 may be in the form of a wire, sheet or other suitable geometry. The directional, non-directional, or partially directional sponge layer may be formed in a number of ways, which are analogous to those used for preparing porous particles.

For example, directional, non-directional, or partially directional sponge layers may be formed by an oxidation reaction followed by a reduction reaction in which the entire substrate, or only an outer layer of the substrate surface is first oxidized to form an oxide layer and having a larger volume than the metal consumed, and then is reduced to the metal. This is similar to the method disclosed for forming porous particles by oxidation and reduction. This provides a porous layer on the surface of the substrate (or an entirely porous layer if all of the substrate is oxidized). The pores are generally directional, but may be partially directional or non directional in some instances.

Alternatively, porous sponge layer may be formed by depositing the porous layer on the substrate in a manner in which pores are formed. For example, methods analogous to those used for forming dendritic sponge particles may be used In this method, the substrate, either as a wire or sheet, is used as the nucleation material and the sponge is grown on the substrate.

By controlling the temperature of the substrate, e.g. by resistively heating it, the sponge forms on the substrate rather than as particles. The sponge formed is generally directional, but may be non-directional or partially directional, depending on the reaction conditions of the deposition reaction.

In a third method, porous sponge layers are formed by freezing a liquid mixture of the sponge material and an insoluble substance. Rather than allowing the mixture to form particles, as described earlier, the sponge forms on a sheet or strip of the substrate which is positioned in the cooling mixture. Although the porous layer of sponge is generally directional, it may be partially directional or non-directional, depending on the processing conditions. For example, if the mixture is cooled quickly, the porous layer is likely to be lower in directionality than a corresponding layer cooled more slowly. Or, if the process is repeated to build up the thickness of the porous sponge layer, the directionality may be lower.

Alloyed Sponges and Particles

Figure 19:
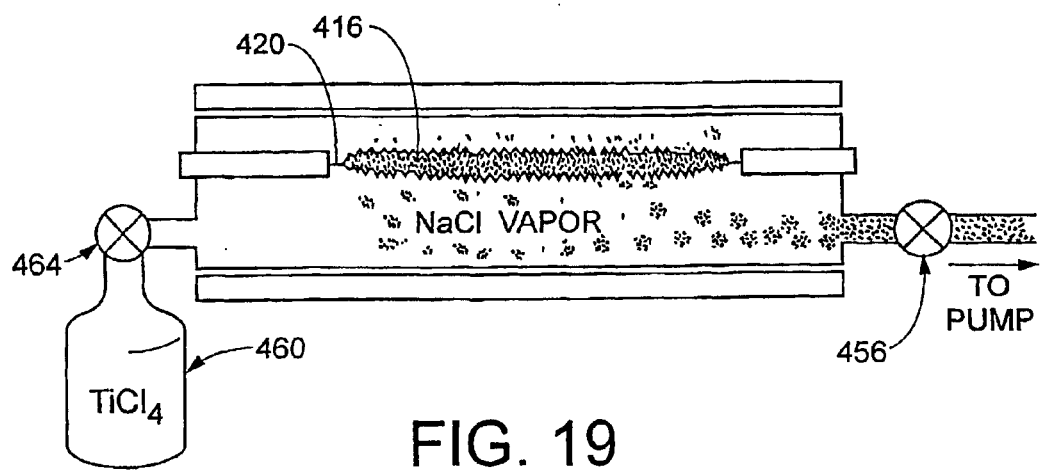
FIG. 19 is a schematic view of the system of FIG. 18 during the distillation phase.

Alloyed particles and sponges can be formed by the methods described above. For example, an alloy of titanium and beryllium is readily formed with a composition in the range of from about 1 to 67 parts beryllium, the balance titanium. The alloy may be produced by the methods described above, including solidification as a ribbon, as shown in FIGS. 20 and 21, and solidified on a suitable substrate, as shown in FIG. 19. The alloy can be solidified as powder particles by an atomization process. For example, alloyed metal sponge particles or doped metal sponge particles may be formed by the reduction process. Doped metal particles are those in which the metal is predominantly a single element but contains small quantities of one or more other metals. The mixed or doped metal sponge particles are readily formed from previously prepared metal compound particles or from grown or sintered scales, as described above. For example, particles comprising an alloy of Ti and Be may be formed from a layer of particles of beryllium titanate or from a grown scale of beryllium titanate formed by thermal oxidation of a Ti:Be alloy. Reduction of the beryllium titanate particles or grown scale is achieved by reaction, for example with calcium, at elevated temperatures, followed by leaching of the calcium oxide from the pores of the reduced Ti:Be alloy sponge.

Figure 22:
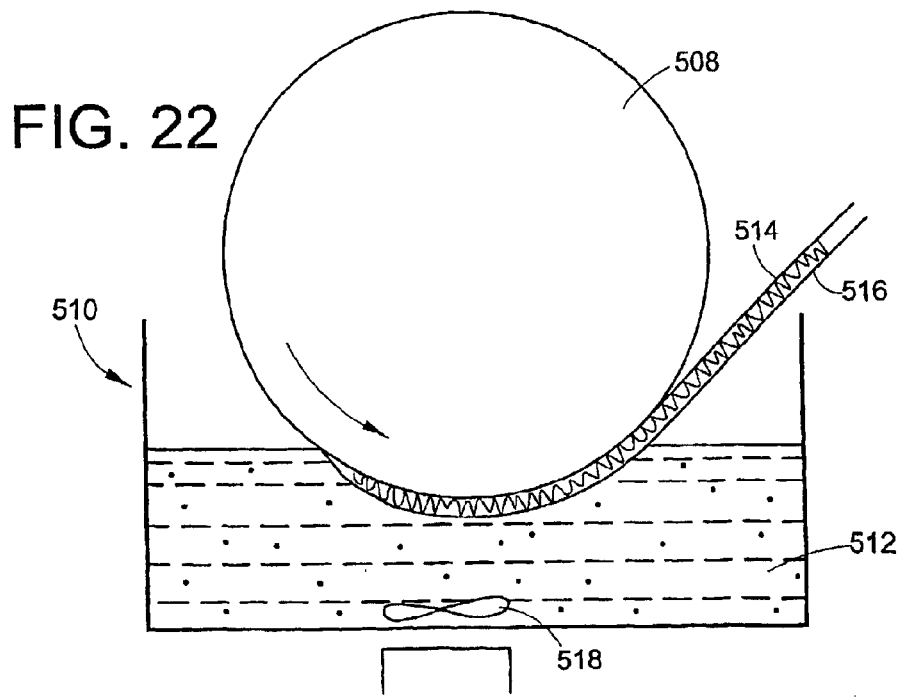
FIG. 22 is a side schematic view to show an alternative embodiment of a ribbon extrusion system; and, FIGS. 23A, 23B, 23C, and 23D are schematic views of a metal substrate A) prior to oxidation, B) after oxidation, C) after partial reduction, and D) after complete reduction of the oxide film.

The solidification method may also be used to form the alloy sponge or particles. By selecting a relatively fast cooling rate during solidification, the alloy can be made quasi-homogeneous. Alternatively, with slower cooling rates, the alloy consists of a lamellar aggregate of different phases, such an aggregate comprising lamellae of β-Ti—Be alloy and lamellae of $TiBe_2$ or TiBe. The β-Ti—Be alloy tends to separate on further cooling to room temperature into lamellae of α-Ti with a small amount of Be in solid solution (<1 atom percent) and lamellae of $TiBe_2$. The quasi-homogeneous alloy thus formed can be further processed to form a sponge with a high specific surface area, as illustrated in FIG. 22, that is, by oxide scale growth and subsequent reduction. Such sponge is then anodized to form capacitor anodes having a dielectric film of titanium beryllium oxide, which has a high dielectric constant.

A heterogeneous alloy, for example of α-Ti and $TiBe_2$ lamellae can be etched to form a capacitor anode with a high specific surface area. The etching is preferably conducted in a way that selectively removes one of the phases to a desired depth, and leaves the other phase intact.

Etching may be carried out, for example, in an acid etchant or with a halide gas. Suitable halide gases include fluorine, chlorine, bromine, iodine, or astatine, alone or in combination. Suitable temperatures for halide etching Acid etching is preferably conducted at a temperature between the freezing and boiling points of the acid.

Fabrication of Capacitors

The capacitors may be assembled in a number of ways. The following examples are therefore not to be considered as limiting the scope of the invention.

Method 1.

Figure 11:
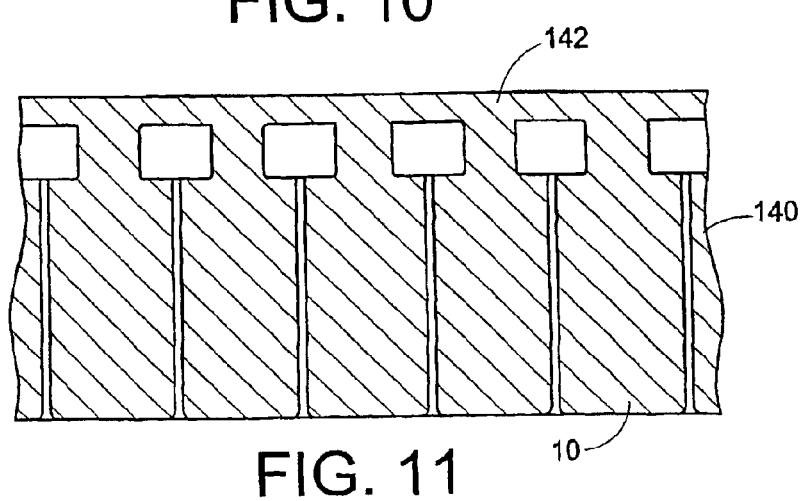
FIG. 11 is a top view of a strip of substrate material with anode shapes stamped for subsequent removal.

A flat sheet 140 of metal or alloy is stamped into the appropriate shapes for the anodes. These may be formed as a strip 142 of anodes which are later separated into a number of separate anodes 10 (or anode layers 40). (FIG. 11) The strip 142 of anodes may be covered with particles 18 and the dielectric layer 36 formed thereon prior to separating the strips into individual anodes. Where the capacitor electrolyte 24 is a solid, it may be applied over the dielectric layer prior to separating the anodes. The anode 10 and cathode 12 are then assembled into a capacitor and the electrolyte 24 (if liquid) and filler material 44 are infiltrated.

Method 2.

A flat sheet, wire, or other suitably shaped substrate 114 material is formed into the shape of the anode 110. A sponge porous layer 116 is grown on the substrate. The steps of forming a dielectric layer, adding the capacitor electrolyte and packaging the capacitor are analogous to those of method 1.

Anodes Formed without Porous Layers

In another preferred embodiment, a capacitor is formed in which the anode lacks the layer 16 of particles. Other components of the capacitor are as described elsewhere in the specification. In this embodiment, the anode is preferably formed from a thin sheet or several sheets of the substrate material, i.e. the capacitor may be analogous to the capacitor of FIG. 2, but without the particles. By thin, it is meant that the thickness of the substrate material comprising the anode is preferably less than 20% of the longest dimension of the substrate layer, and more preferably less than 5% of the longest dimension.

The substrate material may be doped or alloyed with elements which lead to formation of a dielectric film with a high dielectric constant. Dielectric constants of 900 and above can be achieved with a dielectric film formed by oxidation of the surface of a titanium film which has been doped with calcium and optionally other elements. Dopants can also be introduced during formation of the dielectric by introducing the dopants as vapor before, during or after oxidation of the substrate. The dopants may also be introduced in the electrolyte. Alternatively, or additionally, the titanium may be alloyed with an element which forms a titanate when oxidized, such as beryllium. Alloys which can be easily worked are preferred. For example, a titanium beryllium alloy is readily formed into a sheet from which anode shapes can be stamped. Particularly preferred alloys include alloys of titanium and one or more of Zr, Nb, Pb, Ta, Hf, Be and alloys of Ta and Zr. Suitable dopants for Ti include Be, Mg, Ca, Ba, Sr. Other suitable dopants and alloying materials are described elsewhere in the specification.

This embodiment of the anode may be employed with cathodes which are also formed from sheets, as in the capacitor of FIG. 2, or may be used with a cathode having a layer of solid or porous particles, as for the anode of FIGS. 1 and 2, or formed from a continuous layer of sponge Incorporation of Capacitors into Printed Circuits Current silicon chip technology and other integrated circuitry (IC) applications may benefit from direct incorporation of capacitors of the present invention. Capacitors of micron or submicron dimensions may be formed on a semiconductor substrate, such as a silicon chip, using known patterning and deposition techniques.

With reference to FIG. 12, one embodiment of a method of stepwise formation of a capacitor C on a silicon substrate 200, or other suitable support material, is shown. Other suitable semiconductor substrates may be used, such as those formed of Ge, SiC, and GaAs. Portions of the surface 202 of the support material 200 are first masked with a mask material 204, such as photoresist, to define unmasked areas 206 of the surface which will receive the capacitor or capacitors of the present invention (FIG. 12A). Then a thin layer of capacitor anode substrate material 208, which may be a pure metal, such as titanium, or an alloy thereof, is deposited on the unmasked portion 206 (FIG. 12B). Chemical vapor deposition, physical vapor deposition, or sputtering are suitable methods of depositing the substrate material, although other methods of depositing thin layers are also contemplated. A porous layer 216 is then formed on the substrate (FIG. 12C). This can be achieved by the techniques described above. For example, the surface of the substrate may be converted to a compound of larger volume, such as an oxide, and then reduced, or otherwise reconverted, to the metal, leaving a porous layer 216. Of course, the entire substrate 208 may be converted to the compound if desired, then reconverted partially or fully into a layer of metal sponge, thereby forming a capacitor anode.

Alternatively, the porous layer may be formed by depositing particles, such as the solid or porous particles 18 and 18', on the capacitor anode substrate, or directly on to the unmasked area. Or the porous layer may be sponge grown on the substrate. The sponge is preferably directional, although non-directional and partially directional sponge layers are also contemplated. In one preferred embodiment, the anode comprises a sheet of sponge which is grown directly on the support material 200 or attached thereto.

Optionally, the porous layer 216 is eliminated altogether. In this case, the anode comprises simply the deposited substrate material, 216, such as a thin layer of titanium, or an alloy, such as a titanium beryllium alloy.

As can be seen, the anode of the capacitor may comprise a substrate layer 208, a porous layer 216, or both.

The capacitor is completed as described above, by adding a dielectric film 236, preferably formed by anodizing the surface of the porous layer 216. Or, where the porous layer is omitted, by anodizing the substrate layer 208 to form the dielectric layer directly on the metal substrate. Suitable dielectric materials include those described above. Dielectric films of $TiO_2$, $TiBaO_3$, $TiBeO_2$, $TiSrO_3$, $TiCaO_3$, and $TiMgO_3$ are particularly preferred.

Alternatively, a dielectric film 236 of, for example, $BaTiO_3$, may be sputter deposited on the porous layer 216 or other anode layer, in the manner described earlier, with optional anodization of the sputter-deposited film to plug any defects with anodically formed titanium oxide.

Figure 12A:
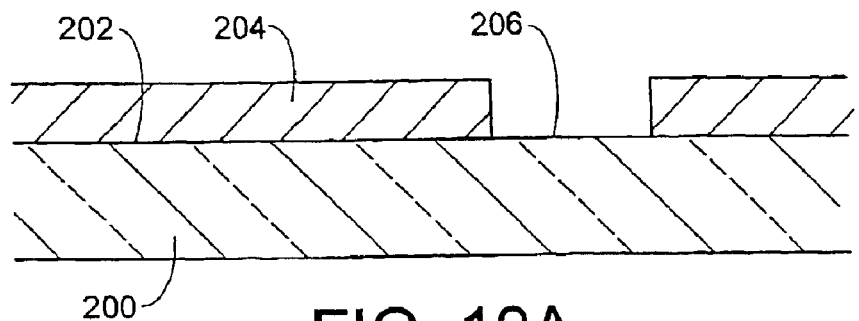
FIG. 12A shows a sectional view of a semiconductor substrate after patterning with a photoresist layer.
Figure 12B:
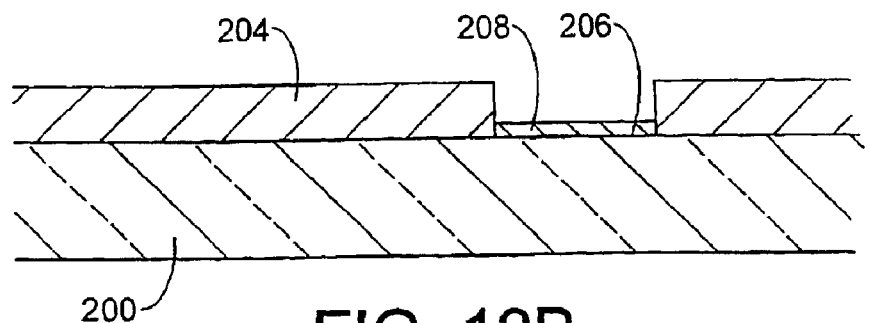
FIG. 12B shows the deposition of an anode layer.
Figure 12C:
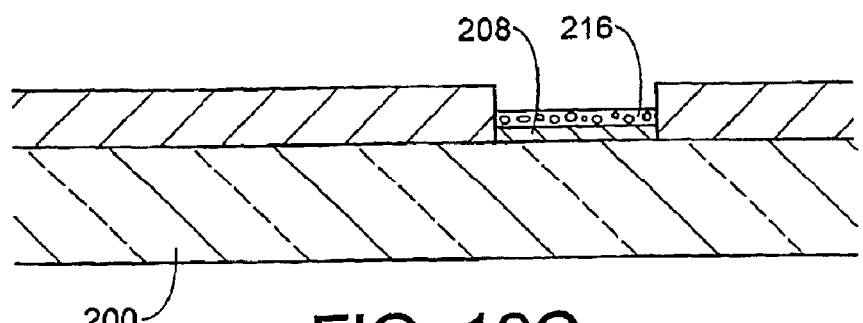
FIG. 12C shows the formation of a dielectric layer.
Figure 12D:
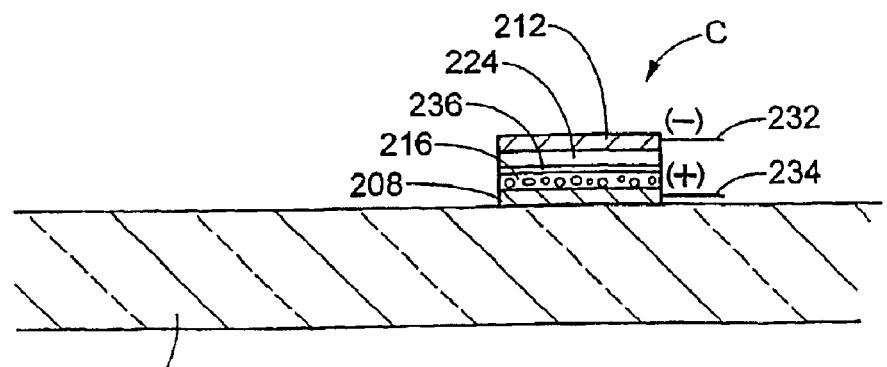
FIG. 12D shows the complete capacitor on the substrate.
Figure 12E:
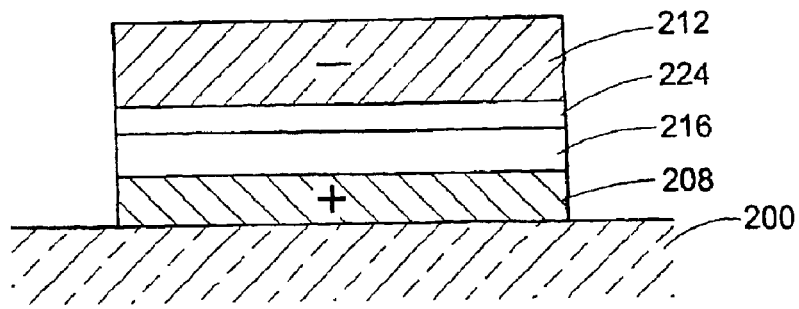
FIG. 12E shows an enlarged view of the capacitor of FIG. 12D.

A capacitor electrolyte 224 (and optionally a filler material) and a cathode 212 are then added as shown in FIGS. 12D and 12E. These layers may be added by known deposition or sputtering techniques. Connecting leads 232 and 234 connect the anode and cathode with other components of an electrical circuit (not shown). Alternatively, as discussed, below, one of the connecting leads is unneccesary where the capacitor is located over a gate of a semiconductor chip. The cathode, solid electrolyte, and connection leads may be formed by sputtering or other methods of thin layer deposition. As discussed above, dopants may be incorporated into the dielectric film 236, either during formation of the dielectric film, or by incorporating dopants into the anodizing electrolyte. Preferred dopants are earth alkali elements, such as calcium.

In one preferred embodiment, the capacitor C is used as a surge protector for computer chips. The capacitor has a low heat output and a high dielectric constant (900 for Ca-doped titanium dioxide, compared with 4 for silicon dioxide). Thus, it can be put directly on a computer chip to protect the chip against surges in current without damage to the chip from overheating of the capacitor.

Figure 12F:
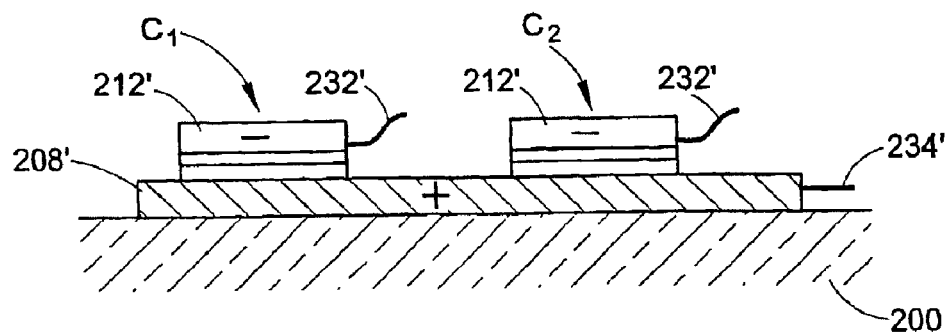
FIG. 12F shows a series of capacitors formed on a common anode.
Figure 12G:
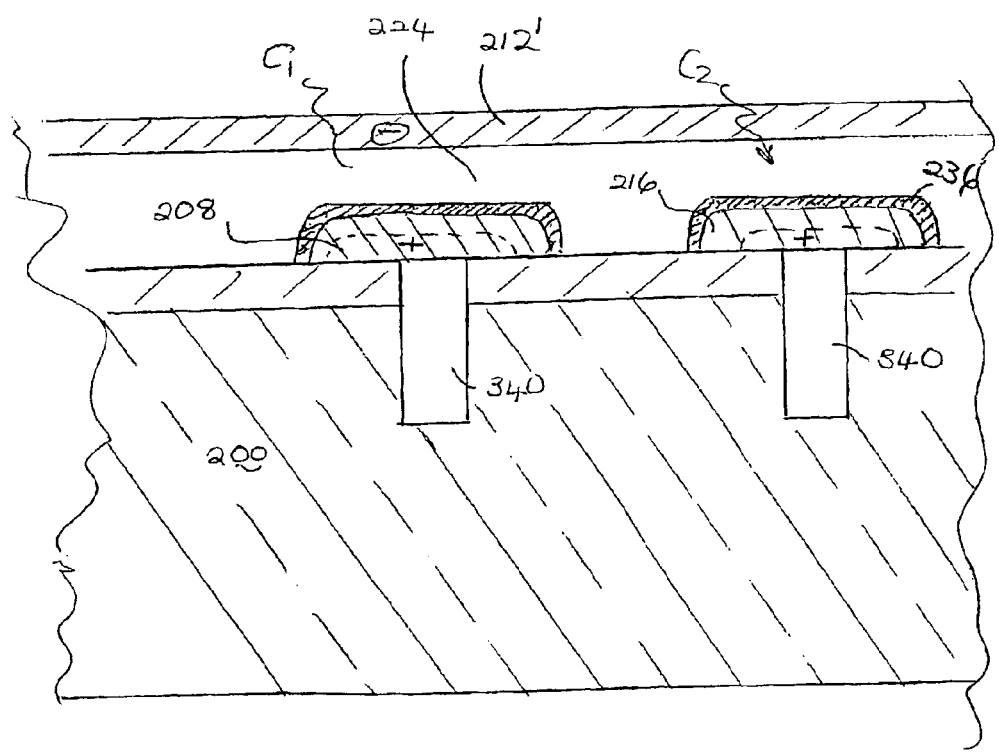
FIG. 12G shows a side view of an exemplary DRAM capacitor.

In another preferred embodiment, several capacitors C1, C2, etc., may be formed on a single chip 200. These may be connected by a common anode 208', as shown in FIG. 12F, or a common cathode 212', if desired (FIG. 12G). More complex, multilayer capacitors of the type shown in FIG. 2 may be formed with submicron dimensions on a semiconductor substrate by conventional semiconductor processing techniques.

For example, dynamic random access memory (DRAM) devices may be formed using the above methods (see FIG. 12G). These devices have large numbers of capacitors C1, C2 on a single chip, each one with its own gate 340 formed in or on the underlying silicon substrate 200. As will be appreciated, the capacitors form a matrix comprising many hundreds, thousands, or even millions, billions, or trillions of such capacitors or bits.

Current DRAM chips use capacitors in which the anode and dielectric are formed by deposition techniques. In such chips, the size of the capacitor is governed by the dielectric strength. For capacitor dielectrics formed by deposition techniques, relatively tall anode stacks are used to provide sufficient surface area for the dielectric. Achieving even coating of the sides of the tall stacks with the dielectric material by conventional deposition techniques is problematic.

The present method, in which the dielectric layer is electrolytically generated from the substrate layer (e.g., anodically grown thereon), allows for a much smaller stack height because the dielectric strength of the anodically grown dielectric formed is significantly higher. For example, the substrate layer 208' may be as little as about 0.1–1.0 micrometers in its largest dimension, while still achieving the necessary capacitances for acting as an on-off switch. The thickness of the substrate depends on the thickness of dielectric material desired. For example, an initial thickness of from about 20 Angstroms up to about 0.5 micrometers for the substrate layer can yield an oxide layer of a similar thickness. The ultimate minimum size of the capacitor is currently limited by the ability of the lithographic techniques to define smaller and smaller areas and form the underlying semiconductors, such as gates.

As shown in FIG. 12G, a DRAM capacitor has spaced gates 340 formed of poly —Si or other suitable semiconductor materials, e.g., by conventional lithographic techniques. The gates control the conductivity from the silicon substrate 200 to the capacitors and can be selectively "opened" to allow current to flow. The gates are spaced one from another by an insulating layer of silicon dioxide. A layer of titanium metal is deposited over the area of each of the gates by chemical or physical vapor deposition or other suitable method. Physical vapor deposition is particularly effective. In this method the substrate material is evaporated and drawn to the semiconductor substrate by an electron beam. While titanium is a preferred substrate material, other substrate materials such as those listed above may be used, particularly Zr, Nb, and Ta, or combinations of these elements. As described above, the substrate material may be doped, for example with alkali earth metals, particularly Ba, Ca, or with Pb or similar metals. A particularly preferred substrate material has been found to comprise Ti, Pb, and Zr, in order to form lead-zirconium titanate when oxidized.

The titanium or other substrate material is then electrolytically converted to the oxide to form the dielectric film. For example, a few drops of an electrolyte are applied to the surface of the chip to contact the titanium layers. Suitable electrolytes include dilute phosphoric acid and a silicate solution. An anodizing voltage is then applied through each gate and across the titanium to form the dielectric film 236. The voltage is selected according to the desired voltage that the capacitor will sustain in use. For example, an anodizing voltage of +1 to +10 volts may be applied via the gate. The negatively charged electrolyte oxidizes at least a portion of the titanium to $TiO_2$. (If desired, the $TiO_2$ can be reduced back to the metal to form a porous substrate layer 216 and then an outer layer of the porous material reoxidized to form the dielectric layer).

The liquid electrolyte is removed from the surface and replaced by a solid electrolyte material 224. Preferred solid electrolytes are those which are able to repair the dielectric material, if damaged, such as those oxidizing electrolyte materials discussed above. $MnO_2$ is a particularly preferred oxidizing electrolyte. Electrically conductive polymeric electrolytes may also be used. The $MnO_2$ electrolyte can be formed, for example, by spraying a mist of a manganese nitride solution on to the chip. The nitride is converted to $MnO_2$ by thermal decomposition at a temperature of about 200° C.

A material for the cathode, such as Ag or other conductive metal, is then deposited on the solid electrolyte material. As shown in FIG. 12G, a common cathode is used for each of the capacitors in a row, or in the entire matrix, although separate cathodes for each capacitor are also contemplated. Although it is preferred to have an electrolyte material between the anode and cathode for improved contact and repair functions, the electrolyte may be eliminated if desired. In this case, the cathode material, e.g. Ag, is deposited directly on the dielectric material.

The above method allows capacitors with high charge densities to be readily achieved. Charge densities of up to about 6 pC or more per square micrometer, for doped titanium anodes, or up to about 1 pC per square micrometer, for undoped titanium anodes, are achievable, which is at least an order of magnitude or two orders of magnitude greater than can be achieved with conventional semiconductor techniques ("p" represents pico-$10^{-12}$). Dielectric strength for these capacitor materials is up to about 0.1–0.75 volts/nm (preferably over 1 MV/cm, more preferably, 5 MV/cm, or more). This allows much smaller capacitors for achieving desired capacitances. As will be appreciated, a large number of capacitors of, for example 0.1 $\mu$m×0.1 $\mu$m in area can be arranged in a small chip area—about $10^{10}$ capacitors/cm$^2$. By stacking several layers of capacitors one on top of the other, even greater packing densities can be achieved. The layers may be stacked, for example from about 10 nm to 10 $\mu$m apart. For, example, for capacitors of about 0.1 $\mu$m×0.1 $\mu$m×0.1 $\mu$m in size, about $10^{16}$ capacitors or bits per cm$^3$ can be obtained. Obviously, larger packing densities can be achieved for even smaller sized capacitors.

The above methods are also useful for forming analog DRAM devices. In these devices, the capacitors can be charged to different voltages, allowing multiple levels of information to be stored in a single capacitor. For example, the dielectric can be formed under an applied voltage of about +10V allowing the capacitor to be charged to voltages of up to 10V. A thicker dielectric layer, and hence a thicker metal substrate layer, are used to permit these higher voltages than for a simple on/off type capacitor, which operates at about +1.5 V. Speed of sampling is improved by forming the analog DRAM in this way since a digital conversion step is not needed.

Addressing each of the individual capacitors or bits can be achieved with conventional DRAM technology. For example, each bit is connected to one of a series of connector pins by an AND gate. Each pin can separately address one of a plurality of capacitors in a row or section of the matrix.

Other applications for the capacitor in semiconductor field include voltage surge protection, power supply during voltage interruption, and noise filtration. For example, a capacitor may be used on each silicon chip of an integrated circuit for surge protection, rather than having a single surge protector for the entire circuit. The power storing capacity of the capacitor provides a means for powering a chip when it is temporarily removed from an integrated circuit or when power supply is interrupted to protect the information stored on the chip.

Capacitors produced using the porous layer 16, 116, 216 described also have a variety of other applications, including devices for the surface mount industry, power supplies, switching regulators, motor control-regulators, computer electronics, audio amplifiers, surge protectors, metal forming machines, and resistance spot welders. Because of their relative compactness compared to conventional capacitors, they can be used in situations were conventional capacitors would be too bully, such as in electrically powered automobiles, trucks and locomotives for electric power management of battery-driven motors, recuperation of breaking energy, and for propulsion of projectiles or space vehicles where weight constraints are important. Capacitors produced with titanium sponge particles are operable at frequencies of 20 Hz to 20,000 Hz. Lower frequencies are anticipated by careful selection of dopants to reduce the leakage of current. The size of the capacitor is variable, from less than one $\mu$m$^3$ to more than one m$^3$, depending on the energy requirement.

Titanium capacitors are capable of delivering up to 1000 times the power of conventional electrochemical supercapacitors. The capacitors may have energy densities of $10^{-2}$ to 100 Wh/kg, or more, and power densities of 100,000 to 10,000,000,000 W/kg, or more, of the total package.

Relationship Between Pore Diameter and Sponge Surface Area

Figure 13:
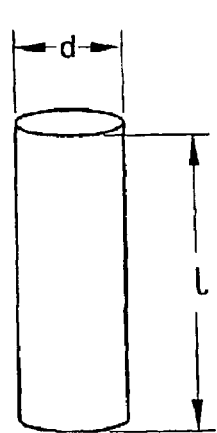
FIG. 13 is a perspective view of an idealized cylindrical-shaped pore or dendrite of a sponge particle for calculation of mean pore diameter or dendrite diameter.

For a sponge particle having cylindrical shaped pores (or rods of sponge material), the total surface area of the sponge $A_{sponge}$ is essentially equal to the total volume V of the cylinders divided by ¼ of the cylinder diameter d (see FIG. 13).

$$A_{sponge} = 4V/d$$

Figure 14:
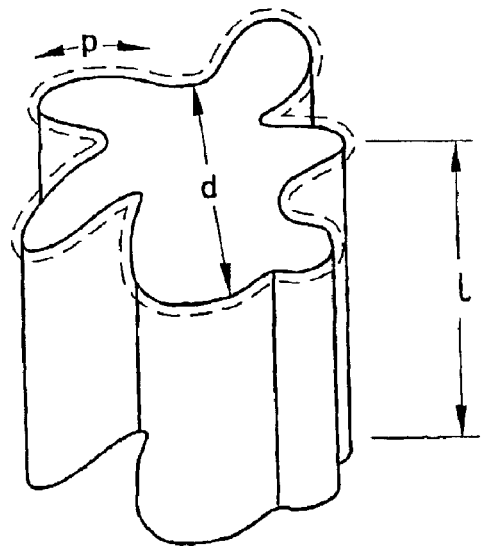
FIG. 14 is a perspective view of a randomly shaped pore or dendrite for calculation of mean pore diameter or dendrite diameter.

For pores (or rods) with irregular shaped cross sections, the actual diameter d is not as relevant as the effective diameter d' where $$d' = 4a/p$$

where: a is the cross sectional area averaged along the accessible length l of the pore, and p is the length of the perimeter of the pore (or rod) (See FIG. 14).

For a sponge, the effective pore diameter d' is given by the equation:

$$d' = 4V/A_{sponge}$$

It should be appreciated that in the examples of typical pore diameters given previously, it is the effective diameter which is being used, since pores rarely have a single uniform diameter along their length.

Directionality of Sponge Layers for Capacitors

The directionality (or non-directionality) of continuous sponges or porous sponge particles can be expressed in terms of the equivalent series resistance (ESR) of the capacitor.

Figure 15:
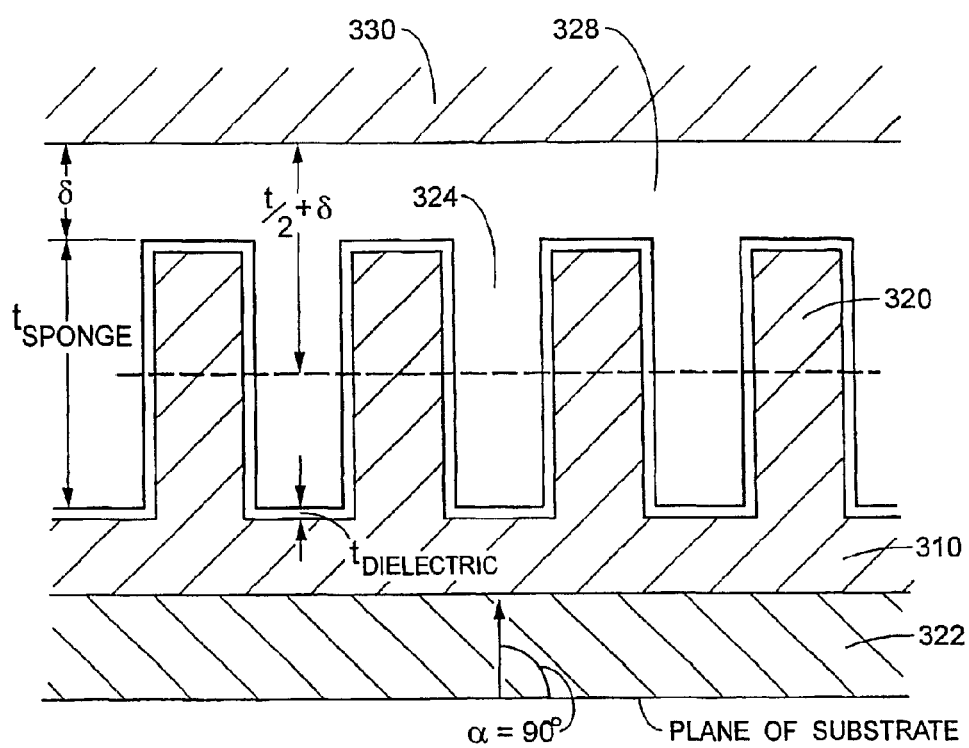
FIG. 15 is a sectional view of an idealized directional capacitor sponge with 90° alignment of all the dendrites (and pores therebetween)

With reference to FIG. 15, an idealized sponge geometry is shown for a capacitor. The sponge 310 has a plurality of dendrites 320, each one being aligned at an angle $\alpha$ to the plane of the underlying substrate 322, where $\alpha=90°$ for a theoretical, completely directional sponge. The height of the dendrites is $t_{sponge}$. Pores 324, between each of the dendrites are also angled at 90° to the plane of the underlying substrate. A continuous dielectric film 326, of thickness $t_{dielectric}$ covers the dendrites and intermediate pores. An electrolyte 328 fills the space between the dielectric and the capacitor cathode 330.

Assuming that the resistance of the sponge metal is negligible compared to the resistance of the capacitor electrolyte, the equivalent series resistance of the capacitor of FIG. 15, $R_{series}$ given by the formula:

$$R_{series} = \frac{\rho(t_{sponge} + \delta)^2 \cdot 1/Y}{2\sin\alpha}$$

Where: $\rho$=resistivity of the electrolyte;

$\delta$=distance between sponge and cathode;

Y=volume of electrolyte between sponge and cathode

When $\alpha=90°$, i.e., when the dendrites are perpendicular, sin $\alpha=1$, so:

$$R_{series} = \rho(\tfrac{1}{2}t_{sponge}+\delta)^2 \cdot 1/Y$$

$\alpha=90°$

Thus, sponge having dendrites inclined at an angle $\alpha$ which is less than 90° to the substrate plane will have an equivalent series resistance that is greater than that of dendrites having an angle $\alpha=90°$. Thus, for low series resistance it is desirable to have $\alpha$ close to 90°.

Another cause of increased series resistance over that of the ideal directional sponge of FIG. 15 is due to the occurrence of side branching of electrolyte-filled pores or pores of non-uniform cross section. The equivalent series resistance of such sponges is greater than that of the ideal directional sponge by a factor which depends on the detailed geometry of the sponge.

The directionality factor D is defined herein as the ratio of series resistance $R_{\alpha=90°}$ for a capacitor formed from the ideal sponge with perfectly aligned ($\alpha=90°$) dendrites to the series resistance $R_{actual}$ of the capacitor to be evaluated, i.e.

$$D = \frac{R_{\alpha=90°}}{R_{actual}} = \frac{\rho\left(\frac{1}{2}t_{sponge} + \delta\right)^2 \cdot 1/\Upsilon}{R_{actual}}$$

Preferably, $R_{actual}$ is measured in the frequency ranges in which the capacitor's dissipation factor is a minimum. For a typical electrolytic capacitor $R_{actual}$ may be measured at a frequency of about 60 Hz.

Obviously, perfectly directional sponges (D=1) are not practically achievable. Completely non-directional sponges (D=0) are also rare. Directional sponges are defined herein as those yielding a capacitor having a value of D between 0.5 and 1 and a preferred Directionality value of between 0.7 and 1.0. Non directional sponges are defined herein as those yielding a capacitor with a D value between 0 and 0.5.

The RC time constant of a capacitor can be determined as follows:

$$RC = \epsilon \cdot \rho \frac{V_{dielectric}}{V_{electrolyte}} \cdot \left[\frac{\frac{1}{2}t_{sponge} + \delta}{t_{dielectric}}\right]^2 \cdot \frac{1}{D}$$

Where: $\epsilon$ is the dielectric constant,
$\rho$ is the resistivity of the electrolyte,
$V_{dielectric}$ is the volume of the dielectric, and
$V_{electrolyte}$ is the volume of the electrolyte.

A short RC time constant is desirable for high capacitor power (high power output and low power dissipation). Thus, a high D value is important for achieving low RC.

Formation of Cathodes with High Surface Area

The cathode 12, may be formed from any suitable conducting material, such as platinum or other metal. However, particularly in low voltage capacitors, a native oxide film which naturally occurs on the cathode surface tends to provide an undesirable counter capacitance in series with that of the dielectric film 24. In such cases, it is preferable for the cathode to have a large surface area.

Figure 16:
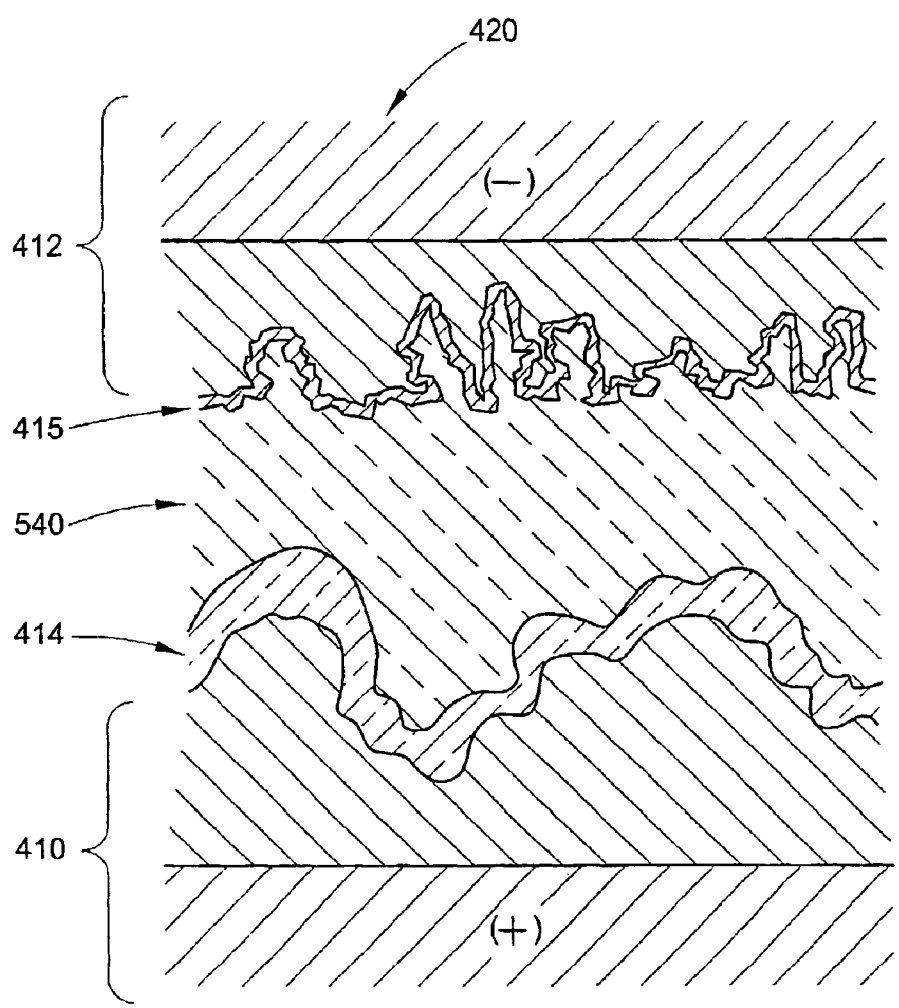
FIG. 16 is an enlarged sectional view of a second embodiment of the anode and cathode of FIG. 1 in which both cathode and anode have a large surface area.

FIG. 16 shows a cross sectional view of a portion of a capacitor in which both the anode 410 and the cathode 412 are of large surface area. The dielectric film 414 on the anode and native oxide film 415 on the cathode are also shown.

There are a number of ways of providing a cathode with a large surface area. The methods described for forming an anode of large surface area by coating the surface with a layer of electrically conductive particles may be employed in the case of the cathode also. Alternatively, a large surface area cathode may be formed by growing a sponge on a suitable substrate.

Formation of High Surface Area Anodes and Cathodes from Directional and Non-Directional Sponges Either the anode or cathode or both the anode and cathode of a capacitor may be formed from a porous sponge, grown as a continuous layer. For example, a capacitor may include an anode of the type shown in FIG. 2 and a cathode formed from a sponge grown as a continuous layer, or vice versa. While particular reference will be made to a capacitor anode having a grown sponge continuous layer, it should be appreciated that the cathode of the capacitor may be similarly formed (although without the step of forming a dielectric layer thereon).

Figure 17:
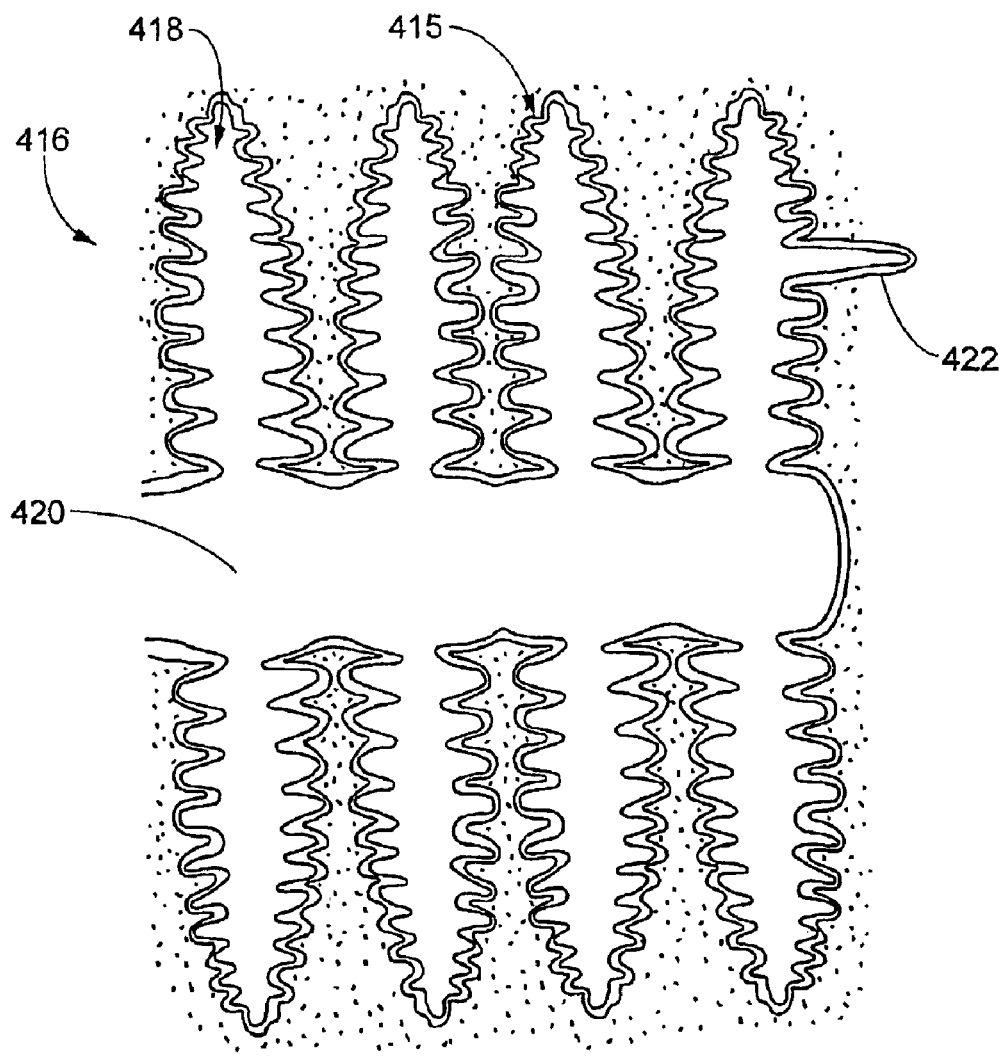
FIG. 17 is a greatly enlarged schematic view of the cathode substrate and dendrites of FIG. 16.

With reference now to FIG. 17, an anode 412 includes a continuous layer of sponge material 416, having numerous dendrites 418, which extend from the surface a substrate 420. Suitable materials for the dendrite sponge 416 include titanium, aluminum tantalum, niobium, zirconium, vanadium, chromium, silicon, germanium, or alloys of these metals. Titanium is a particular good material for the sponge. It is lighter and cheaper than tantalum. Additionally, titanium oxide has an energy density approximately 100 times that of aluminum or tantalum oxide.

The substrate 420 may be in the form of a ribbon, wire, cast structure, or sheet. The substrate provides the sponge with structural stability and electrical conduction. For higher powered capacitors, a thicker cross-section and shorter conduction length is preferred. The substrate may be formed from the same material as the sponge, or a different material. Substrates of silver, copper or aluminum are particularly preferred because their high electrical conductivity provides the capacitor with rapid capacitor discharge at very high power without overheating of the conductor leads.

It should be appreciated that FIG. 17 is not shown to scale, since the dendrites 418 are, in reality, microscopic in size. To provide a large surface area, the sponge comprises fine dendrites which preferably have a width of about 30 micrometers or less, and more preferably of 1 micrometer or less. The interdendritic spaces or pores preferably have a pore size of 30 micrometers or less, more preferably of 300 nm or less.

The dendrites are preferably perpendicular or near perpendicular to the substrate 420 to minimize electrical resistance. The dendrites may in turn have smaller, or secondary dendrites 422 growing from the surfaces to increase further the surface area per unit substrate area. The directionally grown dendrites have a high length to width ratio and are closely and relatively evenly spaced for maximizing the surface area.

While directionality is preferred for increasing the accessible surface area and providing shorter electrical paths for the electrolyte, a certain amount of non-directionality is often inherent in the method of formation. Accordingly, the sponge may be partially non-directional or even substantially non-directional while still providing an improvement over a conventional thin film anode or cathode.

To form the sponge, the dendrites 418 are grown on the substrate material 420. They may be grown on both or only one side of the substrate 420. Several methods are available for forming the dendritic sponge. Three processes have been found to produce particularly uniform dendrites of large surface area.

Chemical Vapor Deposition Process

In the first process, a chemical method, a metal halide, in vapor form, is reduced by a reducing agent, preferably an alkali or earth alkali metal, such that the dendrites of the reduced metal are deposited onto a substrate material. This method is substantially the same as for providing sponge particles by vapor deposition, described earlier, except in that a substrate is used in the reaction chamber. Rather than forming a mist of fine particles in the chamber, dendrites are deposited on the substrate.

For example, a titanium sponge 416 is formed by the reduction of titanium chloride with magnesium, which is deposited on the substrate. Because of the coexistence of the two reaction products, in this case titanium and magnesium chloride, the sponge morphology is developed consisting of titanium dendrites with magnesium chloride residing in the interdendritic spaces. The magnesium chloride, or other alkali metal halide, is removed by draining and vacuum distillation. Vacuum distillation ensures that residual traces of magnesium chloride are removed so that they do not contaminate the sponge. Preferably, the distillation is carried out at between 800 and 1200° C. at a high vacuum to ensure complete removal of the alkali metal halide.

Magnesium and sodium are particularly preferred reducing agents, with sodium being the most preferred because of the easier removal of sodium chloride. Additionally, using sodium as the reducing agent allows selection of the level of coarseness or fineness of the sponge. Very fine sponge can be made at a relatively low temperature (below 700° C.).

Mixed sponges may also be formed by this process. For example, a Ti—Zr alloy sponge may be formed by the reduction of a mixture of $TiCl_4$ and $ZrCl_4$ with an alkali (A) or earth alkali (EA) element.

Figure 18:
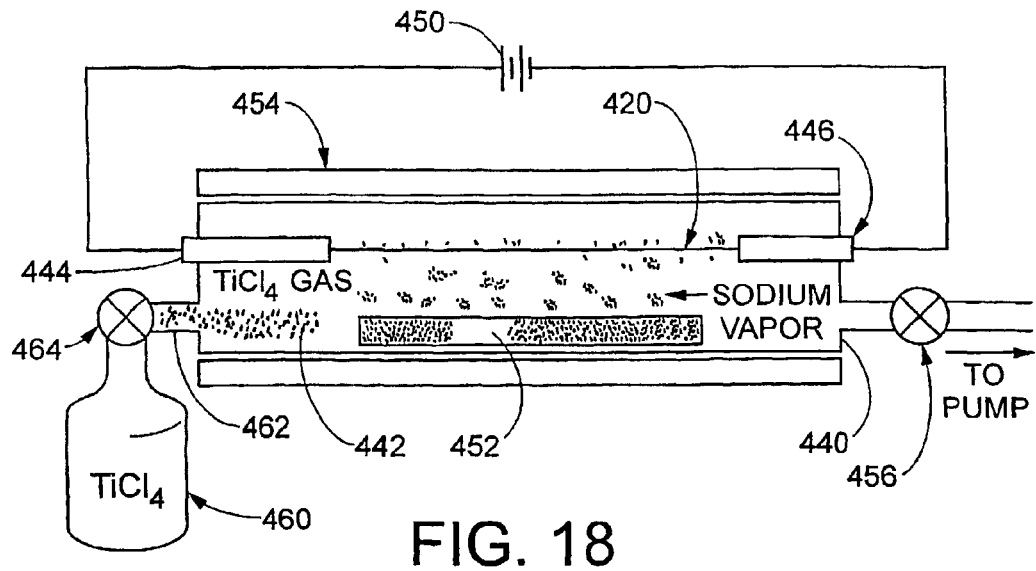
FIG. 18 is a schematic view of a system for chemically forming directionally grown sponges according to the present invention.

By way of example, as shown in FIG. 18, a reaction vessel 440 for carrying out the sponge formation process defines a chamber 442. The substrate 420 is supported within the chamber 440 by electrically conducting connectors 444 and 446. A power supply 450 is connected across the connectors for heating the substrate to a suitable reaction temperature.

A reservoir 452 within the chamber contains sodium, or other reducing metal, to provide a vapor pressure of the reducing agent within the chamber. The vapor pressure generated is dependent on the temperature of the chamber. For example, at 520° C., the vapor pressure of sodium is $10^{-2}$ atmospheres. A heating source 454 surrounds the chamber for heating the chamber to a suitable temperature for providing the vapor.

The heating source 454 is first energized and the chamber brought to the desired temperature for vaporizing the reducing agent. For a sodium reducing agent, a suitable chamber temperature is 705° C., although other temperatures can also be used. The power supply 450 is then energized to resistance heat the substrate 420 to a selected deposition temperature. Typically, the deposition temperature is higher than the temperature of the chamber, such that the deposition of titanium takes place primarily on the substrate. The heated substrate provides a limited number of nucleation sites for growth of dendrites.

The exact microstructure will depend on the number of the nucleation sites and on the processing parameters, namely the vapor pressure of sodium, $P_{Na}$, the vapor pressure of titanium chloride, $P_{TiCl_4}$, and the reaction temperature.

Once the desired chamber and substrate temperatures have been achieved, a source of a halide of the sponge material 460, such as a source of titanium chloride, supplies titanium chloride to the chamber 442 through an inlet 462. An inlet valve 464 between the source 460 and the inlet 462 allows the rate of introduction of titanium chloride to be regulated. At the temperature and pressure of the chamber, the titanium chloride is in the form of a vapor which is reduced by the sodium at the surface of the heated substrate. A directionally outward-growing dendritic sponge of titanium dendrites with sodium chloride in the interdendritic spaces is formed.

Chamber temperatures of 100–1,000° C. are suitable for the formation of a titanium sponge in this manner. For fine sponge, a particularly preferred temperature is below 800° C. The rate of growth and shape of the dendrites is dependent on the temperature. At lower temperatures, the dendrites are fine with large surface areas. However, the growth rate is relatively slow. At higher temperatures, the growth is much faster, but the dendrites are wider and thus have a smaller surface area to volume ratio. Thus the surface area of the sponge can be selected for the desired properties of the capacitor.

Once a suitable growth of sponge has been achieved, the unwanted reaction product, sodium chloride, is removed by vacuum distillation, as shown in FIG. 19. A vacuum pump valve or outlet valve 466 connects an outlet of the reaction vessel to a source of vacuum (not shown), such as a pump. The inlet valve 464 is closed to stop the supply of titanium chloride into the chamber 442 and the source of sodium 452 is preferably sealed or removed from the chamber to prevent unnecessary wastage of sodium. The vacuum pump valve 466 is opened and the temperature of the chamber adjusted to a suitable distillation temperature. The vacuum pump draws the sodium chloride from the interstices in the sponge and out of the chamber. Because of the regular orientation of the dendrites, removal of the sodium chloride is readily achieved from essentially all the surfaces of the sponge. No enclosed pores are created which would trap the sodium chloride.

The time needed for distillation depends on temperature and on the length and width of the gas diffusion paths from the interdendritic regions. The vapor pressure $P_{NaCl}$ of sodium chloride (in atmospheres) is given by the following equation:

$$\log(P_{NaCl}) = -12{,}440\, T^{-1} - 0.90 \log T - 0.46 \times 10^{-3} T + 11.43 \qquad (7)$$

where T is the temperature in degrees Kelvin. The vapor pressure of sodium chloride ranges from $4 \times 10^{-5}$ to $1.9 \times 10^{-2}$ atmospheres in the 800 to 1,000 degree temperature range. Complete removal of the sodium chloride by vacuum distillation is thus readily achieved.

In another embodiment, the substrate 420 is formed from an alloy, such as TiBe. In this embodiment, the Be acts as the reducing agent. The source 452 of sodium vapor is therefore not needed. $TiCl_4$, or other titanium halide, is introduced into the chamber as described above. The chloride reacts with the Be in the alloy to form beryllium chloride. The reaction proceeds as follows:

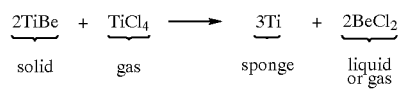

Alternatively, with sufficient Be in the alloy, the reaction proceeds as follows:

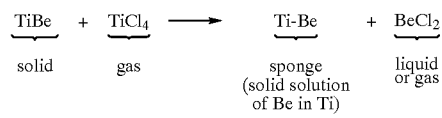

Beryllium chloride boils at 520° C., and thus may be removed by distillation leaving a Ti or Ti—Be sponge on the substrate.

Solidification Process

A second process for forming the dendritic sponge is a solidification method. This is similar to the process described for forming sponge particles, described earlier. The sponge is formed by solidification of a mixed liquid comprising the material for the sponge and an insoluble substance. The insoluble substance is then removed by leaching or vacuum distillation, leaving the sponge-forming metal. The method is particularly suited to the formation of aluminum sponges. Table 1 lists combinations of materials for forming the sponge. The insoluble substance is one which is insoluble in the sponge material selected. It may be an element, or a salt. The sponge formed by this process may be in the form of a sheet, ribbon, or bulk sponge.

The heated liquid mixture of mutually insoluble materials is allowed to cool and solidify. It may be subjected to freezing temperatures to speed solidification. The mixture solidifies with a dendritic structure such that part of the solid consists of the sponge material and the interdendritic spaces consist of the insoluble material. The higher the cooling rate the finer will be the dendrite structure and the greater will be the sponge's surface area per unit substrate area. For example, a mixture of aluminum and potassium solidifies as an aluminum dendrite structure with the interdendritic spaces consisting of potassium. The potassium can be removed, for example, by vacuum distillation leaving an aluminum dendritic skeleton.

The sponge made by the solidification process may be grown as a random (i.e., non-directional or partially directional) sponge where guidance is absent during the solidification process. Alternatively, it may be grown as directionally solidified dendrites on a provided substrate 482 as shown in FIG. 20, or extruded as ribbon, as shown in FIGS. 21 and 22. The directionality of the solidification can be further enhanced by providing a temperature gradient, one in which the substrate is cooler than the growing dendrite. For capacitors, the directionally solidified sponge is preferred since the insoluble interdendritic material is readily removed, there are few inaccessible areas, infiltration of the electrolyte is easier, and the series resistance is lowered.

Figure 20A:
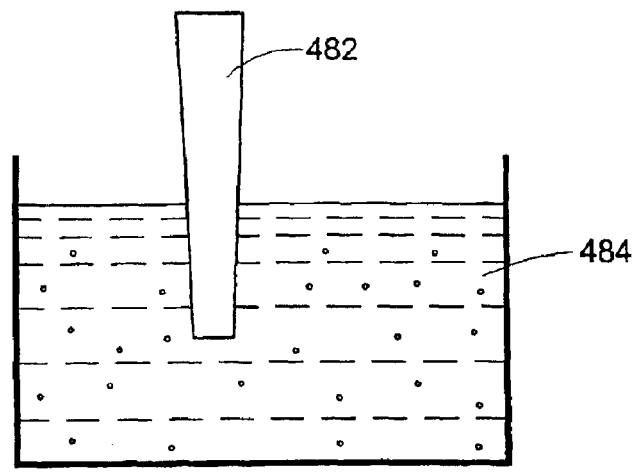
FIGS. 20A, 20B, and 20C are side schematic views to show the progressive growth of a directional sponge by a solidification method.
Figure 20B:
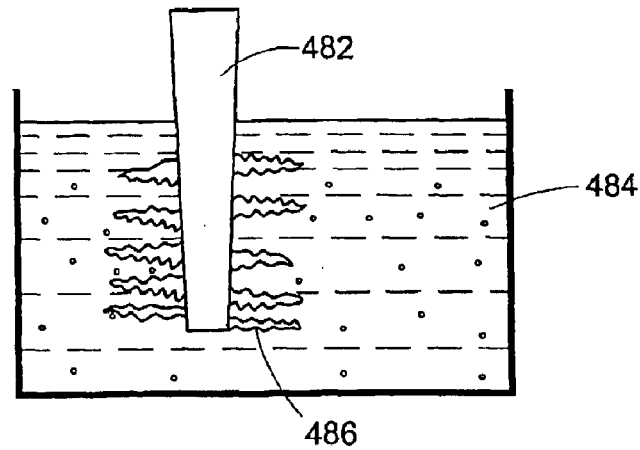
Figure 20C:
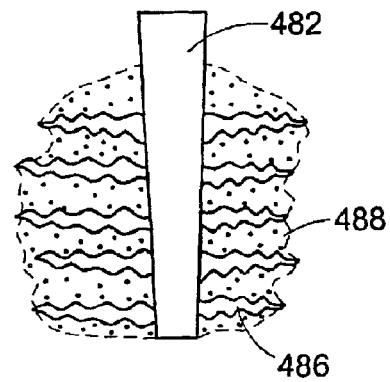

In the embodiment of FIG. 20, a cold metal substrate 482 is dipped into well-mixed molten mixture 484 of a sponge material 486 and an insoluble material 488 (FIGS. 20A and B). As seen in FIG. 20C, dendrites of the sponge material grow on the substrate in a directional manner generally perpendicular to the substrate surface. The insoluble material is rejected into the interdendritic space.

Figure 21A:
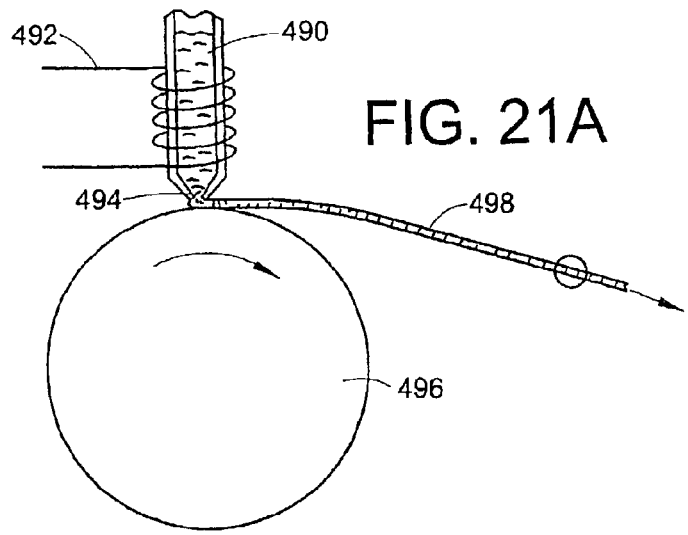
FIGS. 21A and 21B are schematic views of a ribbon extrusion system to show the growth of a dendritic sponge by the solidification process and the extrusion of a ribbon.
Figure 21B:
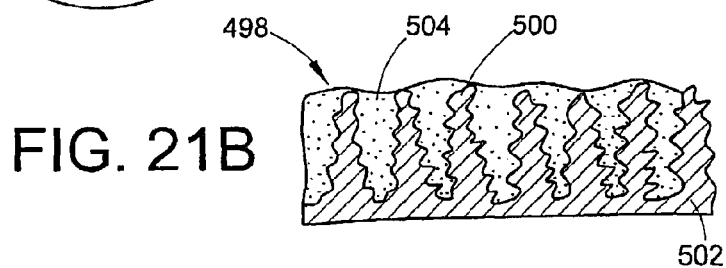

In the embodiment of FIG. 21A, a molten mixture 490 of sponge material and insoluble material is brought into contact with a rotating heat sink. Specifically, the mixture 490, heated by a heating coil 492, is allowed to flow through a narrow aperture 494 onto a rotating cylindrical heat sink 496, such as a chilled roller, positioned below the mixture. As the heat sink rotates, a ribbon 498 of solidified sponge material forms. As shown in the enlarged section of FIG. 21B, the dendrites 500 in the ribbon 498 grow away from the side closest to the heat sink, with a continuous layer 502 of the sponge material closest to the heat sink. As before, the insoluble material 504 is removed from the interdendritic spaces by vacuum distillation.

In the embodiment of FIG. 22, a rotating cylindrical heat sink 508 contacts a bath 510 of the mixture 512 of sponge material 514 and insoluble material 516. Optionally, a stirrer 518 in the bath keeps the sponge material and insoluble material well mixed. As the heat sink rotates, a layer of the mixture adjacent the sink cools and a ribbon 520 forms. As with the embodiment of FIG. 21, the dendrites of the sponge material 514 grow away from the surface of the heat sink and the insoluble material concentrates in the interdendritic spaces.

For the solidification process, the material for the sponge preferably has a melting point which is below about 1,700° C., and more preferably below 1200° C., for ease of processing. Optionally, the sponge material may be an alloy of one or more of the following elements, such as Ti, Be, Mg, Al, Si, Zn, Ga, Ge, As, Se, Cd, In, Sn, Sb, Te, Tl, Pb, Bi, and rare earth elements.

Oxidation/Reduction Method

A third process for forming the dendritic sponge is an oxidation/reduction method. This is analogous to the formation of porous particles 18 by oxidation and reduction. In a first step an oxide scale is grown on a suitable substrate. With reference to FIGS. 23A–D, the substrate 520 may be in the form of a sheet, strip, wire, mesh, or fabricated skeleton of a metal, such as Ti, Ta, or alloys of Ti—Ta, Ti—Zr, Ti—Be, Zr—Be, Ti—Zr—Be, and the like. The thickness of the scale 522 is preferably between 0.5 micrometers and 10 millimeters for anodes, and between 10 nanometers and 10 micrometers for cathodes. The metal is one which has an oxide of the type having a Pilling-Bedworth ratio of greater than 1. When this is the case, the molecular volume of oxide scale 522 produced is greater than the volume of the metal 524 consumed (compare FIGS. 23B and 23A). For tantalum, for example, which has a Pilling-Bedworth ratio of 2.5, the oxide scale is at least 2.5 times the thickness of the metal consumed. The scale may be grown to an extent at which either all or just a portion of the substrate is converted into oxide scale. The thickness of the scale is preferably 1 to $10^3$ times the desired pore size of the metal sponge to be formed.

Figure 23A:
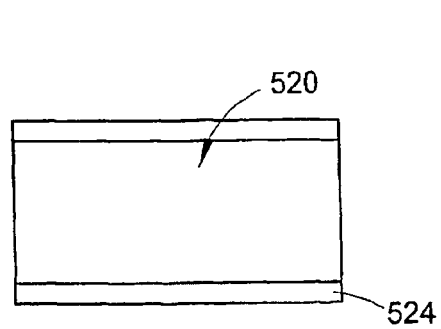
Figure 23B:
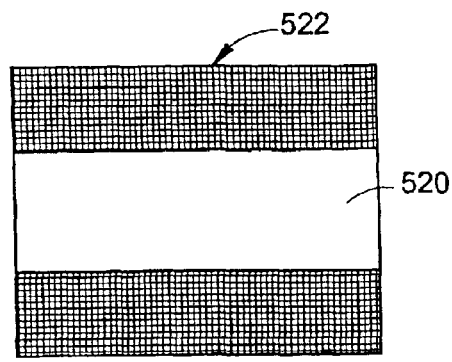
Figure 23C:
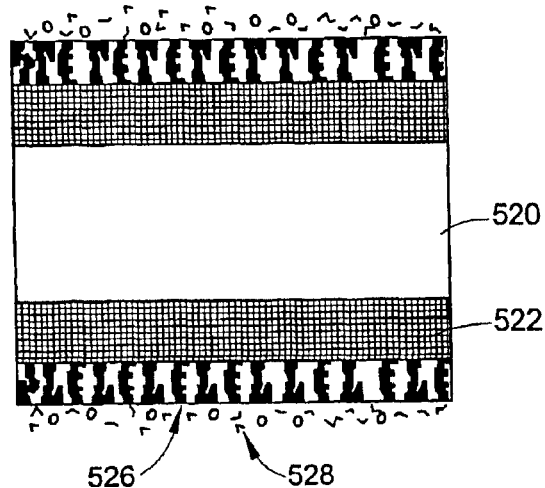
Figure 23D:
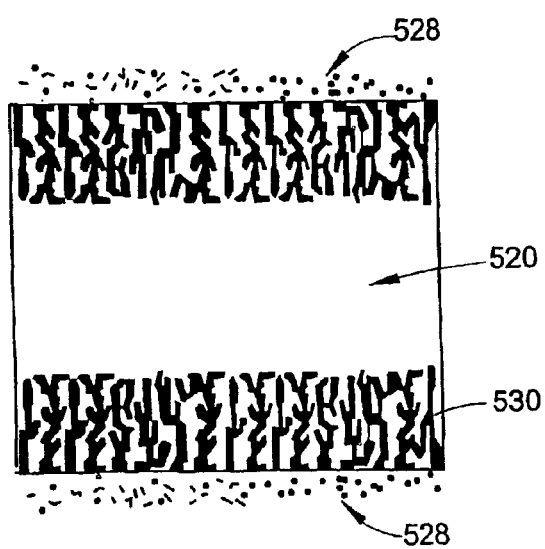

In a second step, shown in FIGS. 23C and 23D, the oxide scale is reduced at high temperature to the metal 526 with a suitable reducing agent 528. For oxides of the metals Ti, Ta, Zr, Be, or their alloys, reducing agents, such as Li, Mg, Ca, Ba, Sr, and hydrogen are effective. The reducing agent 528 is preferably in the form of a gas or liquid. For example, tantalum oxide scale may be reduced to tantalum sponge in the presence of hydrogen as follows:

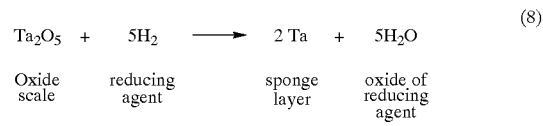
(8)

Similarly, a titanium oxide scale may be reduced to a titanium sponge with calcium as follows:

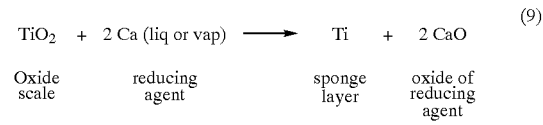
(9)

Since the reduced metal has a smaller volume than that of the oxide scale, the reduced metal is porous. Accordingly, during the reduction reaction, the oxide layer is transformed into a metal sponge with generally directional pores 530 (shown in black in FIGS. 23C and 23D) extending from the outside of the reduced metal towards the substrate reduced metal interface. There may be a certain amount of non-directionality, depending on the conditions used. The pores contain the oxide of the reducing agent, for example, water vapor in the case of hydrogen and calcium oxide in the case of calcium. The oxide may be leached out, for example, with water or an acid, such as acetic acid. In the case of water as the oxide, the water is preferably carried off as vapor. The remaining metal sponge has many of the properties of the outwardly grown sponges prepared by the first and second methods. The sponge has a high surface area with an easily accessible open porosity.

Where only part of the substrate is turned into the oxide scale and then into a metal sponge, the remaining substrate provides a path of high electrical conductivity. The substrate thus feeds or receives electrical current to or from the dendrites. A path of high electrical conductivity is important for high power capacitors which operate at high power density. However, in other instances, it is desirable to have a capacitor with a high energy storage density which can operate with a reduced power density. In this case, the entire substrate may be oxidized and reduced into the sponge.

In the case of an anode, the sponge material is preferably one which forms an oxide which is a good dielectric, although other sponge materials, such as copper, could be used and then coated with a material, such as titanium or tantalum, which forms a good dielectric. A suitable dielectric film may be formed by the methods described for the anode having a layer of particles 18.

A cathode with high surface area (provided either by particles or by growing a sponge), when used in combination with an anode of high surface area produces a lower series resistance capacitor than a conventional cathode employing a thin film or other solid material which lacks pores or dendrites. By lowering series resistance in this way, a capacitor with extremely high power can be formed.

With reference once more to FIG. 16, the series resistance of a capacitor is a sum of the resistances of the materials through which the current passes (anode 410, dielectric film 414, electrolyte 540, native oxide 415, and cathode 412). Net capacitance C is derived approximately as follows:

$$C=1/[1/C_1+1/C_2]$$

Where $C_1$ is the capacitance of the dielectric film on the anode and $C_2$ is the capacitance of the native oxide on the cathode. For high C, a high $C_1$ and, preferably, an even larger $C_2$ are desirable. A large value of $C_1$ is obtained, as described above, by having a large anode surface area and a dielectric substance with high dielectric constant. On the cathode side, a very high capacitance can be achieved by maintaining the native oxide film as thin as possible and by providing a large cathode surface area. A cathode surface formed of a grown fine sponge or attached sponge particles is thus used to provide a large cathode surface area. Fine sponges, particularly those providing a larger surface area than that of the anode, are preferred.

Examples of anode and cathode combinations for forming capacitors and other electrical devices using anodes and cathodes are as follows.

| Anode | Cathode |
| --- | --- |
| I. Thin foil or other conventional anode material | High surface area cathode formed of particles (sponge or solid) or sponge (directional or non-directional) grown on a substrate or without a substrate. |
| II. High surface area anode formed of particles (sponge or solid) or continuous sponge (directional or non-directional) grown on a substrate or without a substrate. | High surface area cathode formed of particles (sponge or solid) (directional or non-directional) grown on a substrate or without a substrate. |
| III. High surface area anode formed of particles (sponge or solid) | Thin foil or other conventional cathode or grown sponge material (directional or non-directional) grown on a substrate or without a substrate. |

Obviously, anodes or cathodes could also be provided from combinations of particles and sponge.

Having thus described the preferred embodiment, the invention is now claimed to be:

1. A capacitor comprising:
   an anode;
   a dielectric film on a surface of the anode; and
   a cathode which includes an electrolyte in contact with the dielectric film, at least one of the anode and cathode comprising a porous layer of particles formed from an electrically conductive material.

2. The capacitor of claim 1 wherein the layer of particles has a thickness of from about 10 to about 500 micrometers.

3. The capacitor of claim 1, wherein the layer of particles has a thickness which is less than about 100 times that of a smallest dimension of an average particle.

4. The capacitor of claim 1, wherein the particles have a diameter of less than about 300 micrometers.

5. The capacitor of claim 1, wherein the porous layer of particles includes particles having internal pores.

6. The capacitor of claim 5, wherein the pores have a width of less than about 30 micrometers.

7. The capacitor of claim 6, wherein the pores have a width of 1 micrometer, or less.

8. The capacitor of claim 5, wherein the particles have a dimension which is from 5 to 1000 times larger than a width of the pore.

9. The capacitor of claim 5, wherein the particles are formed from a sponge material.

10. The capacitor of claim 1, wherein the porous layer has a thickness of less than about ten percent of a largest dimension of the layer.

11. The capacitor of claim 1, wherein the particles include a chemical element selected from the group consisting of titanium, aluminum, tantalum, niobium, zirconium, vanadium, chromium, silicon, germanium, copper, silver, and alloys thereof.

12. The capacitor of claim 11, wherein the element includes titanium.

13. The capacitor of claim 1, wherein the at least one of the anode and cathode includes at least one substrate layer, the particles being located on the substrate layer.

14. The capacitor of claim 13, wherein the at least one of the anode and cathode includes a plurality of substrate layers, the particles being located on the substrate layers.

15. The capacitor of claim 14, wherein the substrate layers are arranged in parallel.

16. The capacitor of claim 13 wherein the substrate layer is formed from a metal which is the same as that of the particles.

17. The capacitor of claim 16, wherein the substrate layer is formed from titanium.

18. The capacitor of claim 13, wherein the substrate layer is formed from a material which includes at least one metal selected from the group consisting of silver, copper, and aluminum.

19. The capacitor of claim 1, wherein the dielectric film includes an oxide formed by oxidizing the surface of the particles.

20. The capacitor of claim 1, wherein the dielectric film includes a dopant selected from the group consisting of oxides of Ba, Ca, Mg, Sr, Be, and combinations thereof.

21. The capacitor of claim 1, wherein the particles include titanium sponge and the dielectric film includes titanium oxide, and wherein the capacitor has a dielectric strength of at least about 7.5 MV/cm.

22. A method of forming the capacitor of claim 1, the method comprising:

providing the anode and the cathode, at least one of the anode and cathode being formed from the porous layer of particles;

forming the dielectric film on a surface of the anode; and locating the electrolyte in contact with the dielectric film.

23. The method of claim 22, wherein the particles include internal pores.

24. The method of claim 23, wherein the particles are formed from a sponge material.

25. The method of claim 24, wherein the particles are formed by a process including at least one of:

a) heating a mixture of a metal for forming the particles with an insoluble second phase to a temperature at which the metal and second phase are both liquid, cooling the liquid mixture to form the particles, and removing the second phase from pores of the particles;

b) oxidizing at least a portion of a surface of metal particles to form an oxidized layer having a larger volume than that of the metal which has been oxidized and reducing at least a portion of the oxidized layer to the corresponding metal; and c) reducing a compound of a metal in vapor form with a reducing agent to form sponge particles of the metal.

26. The method of claim 22, wherein the step of forming at least one of the anode and cathode includes supporting the particles on a substrate layer.

27. The method of claim 22, wherein the step of forming the dielectric film includes oxidizing the surface of the particles.

28. The method of claim 22, further comprising: forming the capacitor on a semiconductor substrate.

29. A semiconductor device comprising:

a semiconductor substrate; and the capacitor of claim 1.

30. The semiconductor device of claim 29, further comprising:

a gate which selectively forms a conductive path between the semiconductor substrate and the capacitor.

31. The semiconductor device of claim 29, wherein the dielectric layer is formed by anodizing a portion of the anode.

32. The semiconductor device of claim 29, wherein the anode includes titanium.

33. The semiconductor device of claim 32, wherein the anode further includes at least one of the group consisting of Zr, Nb, Ta, and Pb.

34. The semiconductor device of claim 32, wherein the titanium is doped with an earth alkali element.

35. The semiconductor device of claim 32, wherein the capacitor has a dielectric strength of at least 1 MV/cm.

36. The semiconductor device of claim 29, further comprising:

a solid electrolyte which spaces the dielectric layer from the cathode.

37. The semiconductor device of claim 29, wherein the semiconductor device comprises a DRAM device and the capacitor has an area of from about $10^{-10}$ to $10^{-15}$ m$^2$.

* * * * *